United States Patent
Savoia et al.

(10) Patent No.: US 11,800,806 B2
(45) Date of Patent: Oct. 24, 2023

(54) METHOD FOR MANUFACTURING A MULTI-CELL TRANSDUCER

(71) Applicant: Microtech Medical Technologies Ltd., Tel Aviv (IL)

(72) Inventors: Alessandro Stuart Savoia, Rome (IT); Giosuè Caliano, Rome (IT); Alexander Melamud, Haifa (IL); Eric S. Tammam, Modiin (IL)

(73) Assignee: Microtech Medical Technologies Ltd., Tel Aviv (IL)

( * ) Notice: Subject to any disclaimer, the term of this patent is extended or adjusted under 35 U.S.C. 154(b) by 505 days.

(21) Appl. No.: 17/077,260

(22) Filed: Oct. 22, 2020

(65) Prior Publication Data
US 2021/0043825 A1 Feb. 11, 2021

Related U.S. Application Data

(62) Division of application No. 14/796,063, filed on Jul. 10, 2015, now Pat. No. 10,847,708.

(60) Provisional application No. 62/023,449, filed on Jul. 11, 2014.

(51) Int. Cl.
*H10N 30/00* (2023.01)
*B06B 1/06* (2006.01)
*H10N 30/03* (2023.01)

(52) U.S. Cl.
CPC ....... *H10N 30/1071* (2023.02); *B06B 1/0622* (2013.01); *H10N 30/03* (2023.02)

(58) Field of Classification Search
CPC .. H10N 30/1071; H10N 30/03; B06B 1/0622; H04R 17/00
See application file for complete search history.

(56) References Cited

U.S. PATENT DOCUMENTS

| 5,619,997 A | 4/1997 | Kaplan |
| 5,834,877 A | 11/1998 | Buisker et al. |
| 5,913,243 A | 6/1999 | Hopeck et al. |
| 5,989,190 A | 11/1999 | Kaplan |
| 6,331,163 B1 | 12/2001 | Kaplan |

(Continued)

FOREIGN PATENT DOCUMENTS

| CA | 2330323 | | 9/1999 |
| CN | 1766331 A | * | 5/2006 |

(Continued)

OTHER PUBLICATIONS

Abbott, W.L., "Performance Testing of Sonar Transducers," Sound & Vibration, vol. 19, No. 12, p. 8, Dec. 1985.

(Continued)

*Primary Examiner* — Jeffrey T Carley
(74) *Attorney, Agent, or Firm* — Cadwalader, Wickersham & Taft LLP

(57) ABSTRACT

A method for fabricating a multi-cell electroacoustic transducer comprises placing a rail layer onto a base, the rail layer comprising a plurality of apertures arranged in an array, filling cavities in the rail layer with a polymer, and applying a flexural plate to the rail layer. The transducer achieves high transmission sensitivity across a broad bandwidth. The transducer may be designed to have a broad or a focused directivity pattern, or may be multi-frequency, depending on the particular application and has a range of applications.

5 Claims, 15 Drawing Sheets

(56) References Cited

U.S. PATENT DOCUMENTS

| | | | |
|---|---|---|---|
| 6,445,108 | B1 | 9/2002 | Takeshima et al. |
| 6,763,722 | B2 | 7/2004 | Fjield et al. |
| 6,770,032 | B2 | 8/2004 | Kaplan |
| 6,771,785 | B2 | 8/2004 | Pompei |
| 6,776,763 | B2 | 8/2004 | Nix et al. |
| 6,806,622 | B1 * | 10/2004 | Schmidt ................. B06B 1/067 310/369 |
| 7,087,264 | B2 | 8/2006 | Suzuki et al. |
| 7,134,341 | B2 | 11/2006 | Girmonsky et al. |
| 7,234,519 | B2 | 6/2007 | Fripp et al. |
| 7,415,883 | B2 | 8/2008 | Kaplan |
| 7,586,236 | B2 * | 9/2009 | Corsaro ................. F16F 15/08 310/322 |
| 8,162,839 | B2 | 4/2012 | Kaplan |
| 8,356,399 | B2 | 1/2013 | Kaplan |
| 9,468,419 | B2 | 10/2016 | Onishi et al. |
| 2006/0043843 | A1 * | 3/2006 | Sugiura ................. G01S 7/521 310/348 |
| 2008/0049955 | A1 * | 2/2008 | Fujiwara ................. H04R 17/00 310/334 |
| 2008/0086056 | A1 * | 4/2008 | Chang ................. G01S 15/8925 600/459 |
| 2008/0290757 | A1 * | 11/2008 | Gao ................. B06B 1/0622 29/25.35 |
| 2010/0011866 | A1 | 1/2010 | Van Klooster |
| 2011/0198968 | A1 | 8/2011 | Sato et al. |
| 2013/0258803 | A1 | 10/2013 | Nakamura et al. |
| 2013/0308425 | A1 | 11/2013 | Nakamura et al. |
| 2015/0187347 | A1 * | 7/2015 | Kojima ............ H10N 30/10516 310/322 |
| 2016/0121368 | A1 * | 5/2016 | Nakamura ............... G01S 15/02 600/459 |
| 2016/0226020 | A1 * | 8/2016 | Jing ........................ B29C 43/18 |

FOREIGN PATENT DOCUMENTS

| | | | |
|---|---|---|---|
| CN | 101006361 | A | 7/2007 |
| CN | 101193711 | A | 9/2008 |
| CN | 101918151 | A | 12/2010 |
| EP | 0 582 557 | A2 | 2/1994 |
| EP | 1493499 | A2 * | 1/2005 ........... B06B 1/0292 |
| JP | 2013-243513 | | 12/2013 |
| JP | 2013-255692 | | 12/2013 |
| JP | 2015-097733 | | 5/2015 |
| RU | 2413336 | | 2/2011 |
| RU | 2435161 | | 11/2011 |
| WO | WO 97/08761 | | 3/1997 |

OTHER PUBLICATIONS

Caliano et al., "A Piezoelectric Bimorph Static Pressure Sensor," Sensors and Actuators A, vol. 46, Issues 1-3, Jan.-Feb. 1995, pp. 176-178.

Caliano et al., "A Track-Pad Device Based on a Piezoelectric Bimorph," Ultrasonics Symposium (IUS), 2011 IEEE International, pp. 1676-1679.

Caronti et al., "Acoustic Coupling in Capacitive Microfabricated Ultrasonic Transducers: Modeling and Experiments," Ultrasonics, Ferroelectrics and Frequency Control, IEEE Transactions on, vol. 52, No. 12, pp. 2220-2234, Dec. 2005.

Decarpigny et al., "The Design of Low-Frequency Underwater Acoustic Projectors: Present Status and Future Trends," IEEE J. Oceanic Eng., vol. 16, No. 1, pp. 107-122, Jan. 1991.

Sherman, C.H., "Analysis of Acoustic Interactions in Transducer Arrays," IEEE Trans. Sonics & Ultrasonics, SU-13, No. 1, p. 9-15, 1966.

Smits et al., "The Constituent Equations of Piezoelectric Heterogeneous Bimorphs", IEEE Trans Ultrason Ferroelectr Freq Control. 1991; 38 (3): 256-270.

Wilson, O.B., Introduction to Theory and Design of Sonar Transducers, Peninsula Publishing, Los Altos, CA 1988, pp. 159.

International Search Report and Written Opinion from co-pending application No. PCT/IB2015/001724 dated Jan. 21, 2016.

Russian Search Report from corresponding application RU 2017104430 dated Feb. 7, 2018, 4 pages.

Office Actions and Responses from related U.S. Appl. No. 14/796,063: Notice of Allowance dated Jul. 22, 2020; Amendment and Response to Final Rejection with Request for Continued Examination dated Jun. 25, 2020; Final Rejection dated Apr. 2, 2020; Amendment and Response to Non-Final Rejection dated Jan. 17, 2020; Non-Final Rejection dated Oct. 18, 2019; Request for Continued Examination dated Sep. 19, 2019; Advisory Action dated Sep. 18, 2019; Amendment and Response to Final Rejection dated Aug. 19, 2019; Final Rejection dated Jun. 25, 2019 Amendment and Response to Non-Final Rejection dated Mar. 25, 2019; Non-Final Rejection dated Dec. 31, 2018; Amendment and Response to Final Rejection with Request for Continued Examination dated Dec. 6, 2018; Advisory Action dated Nov. 30, 2018; Response to Final Rejection dated Nov. 6, 2018; Final Rejection dated Sep. 7, 2018; Amendment and Response to Non-Final Rejection dated Apr. 26, 2018; Non-Final Rejection dated Jan. 26, 2018; Response to Election/Restriction Requirement dated Jan. 4, 2018; and Requirement for Restriction Election dated Nov. 27, 2017.

Request for Continued Examination dated Sep. 19, 2019; Advisory Action dated Sep. 18, 2019; Amendment and Response to Final Rejection dated Aug. 19, 2019; Final Rejection dated Jun. 25, 2019 Amendment and Response to Non-Final Rejection dated Mar. 25, 2019; Non-Final Rejection dated Dec. 31, 2018; Amendment and Response to Final Rejection and Request for Continued Examination dated Dec. 6, 2018; Advisory Action dated Nov. 30, 2018; Response to Final Rejection dated Nov. 6, 2018; Final Rejection dated Sep. 7, 2018; Amendmen and Response to Non-Final Rejection dated Apr. 26, 2018; Non-Final Rejection dated Jan. 26, 2018; Response to Election/Restriction Requirement dated Jan. 4, 2018; and Requirement for Restriction Election dated Nov. 27, 2017.

Extended European Search Report dated Aug. 23, 2022, application No. 22184978.9-1001, 7 pages.

* cited by examiner ns in transducer arrays," IEEE Trans. Sonics and Ultra-
METHOD FOR MANUFACTURING A MULTI-CELL TRANSDUCER This application is a divisional of U.S. application Ser. No. 14/796,063, filed Jul. 10, 2015, which claims the benefit of priority to U.S. Provisional Application No. 62/023,449, filed on Jul. 11, 2014, entitled "Multi-Cell Transducer," all of which are hereby incorporated by reference in their entirety.

FIELD OF INVENTION

This invention relates to a novel electroacoustic transducer, in particular a multi-cell transducer, an ultrasonic transmitter incorporating such a multi-cell transducer, and a method of manufacturing such an electroacoustic transducer.

BACKGROUND OF THE INVENTION

Electroacoustic transducers convert electrical energy into mechanical oscillations at a frequency in the acoustic range, for example, in the sonic or ultrasonic range, and/or may receive such sound waves and convert the mechanical energy into electrical energy. Such conversion may be achieved by, for example, piezoelectric devices. Piezoelectric devices may have a layered structure, including one or two piezoelectric layers and a flex layer capable of vibrating, which typically is metal but also may be a non-metallic material.

The efficiency of an acoustic transmitter is a function of the radiation and mechanical transduction efficiencies of the device, and the overall efficiency of a single element transmitter having one transducer can be low even when the mechanical transduction rate is high. Combining a number of transducers in an array can overcome some of the deficiencies of single element transmitter, including concentration of available acoustic power into a beam thereby yielding an increased source level. Decarpigny, J. N. et al., "The design of low-frequency underwater acoustic projectors: Present status and future trends," IEEE J. Oceanic Eng., vol. 16, no. 1, pp. 107-122, January, 1991; Wilson, O. B., "Introduction to Theory and Design of Sonar Transducers", at 159, Peninsula Publishing, Los Altos, Calif., 1988. Arrays may also improve signal to noise ratio and sensitivity. For a given acoustic signal, an array may generate higher voltages when units are connected in series, and may generate higher currents when units are connected in parallel. Abbott, W. L., "Performance testing of sonar transducers", Sound and Vibration, vol. 19, no. 12, p. 8, 1985. Nevertheless, interactions between individual elements of closely packed arrays can lead to different acoustic loading on each transducer element, depending on its location in the array, which can lead to variations in the volume velocity of each element in the array. Sherman, C. H., "Analysis of acoustic interactions in transducer arrays," IEEE Trans. Sonics and Ultrasonics, SU-13, no. 1, p. 9-15, 1966. This can cause significant variations in the volume intensity of each array element. Thus, despite the improvements to power and signal to noise ratios that a transducer array can provide, the interactions between elements of the array can actually reduce acoustic output power; in extreme cases, individual elements of the array may have negative radiation resistance and actually absorb acoustic power. Such interactions can be especially problematic when transducer elements are small compared to the wavelength of the radiated field and when they have a high efficiency.

Electroacoustic transducers may be used in speakers, microphones, and ultrasonic transceivers. In the medical device field, such transducers may be used in conjunction with implantable resonating sensors, for example, passive resonating ultrasonically excitable sensors, as described for example in U.S. Pat. No. 7,134,341 to Girmonsky, U.S. Pat. No. 5,619,997 to Kaplan, and U.S. Pat. No. 5,989,190 to Kaplan. In such systems, the electroacoustic transducer is an external unit that generates ultrasonic waves as input to the implanted sensor, and may receive ultrasonic signals from the implanted sensor that represent information about the measurand detected by the sensor, converting those signals into electrical signals for processing into a user readable format.

Commercially available ultrasonic emitting devices having electroacoustic transducers are generally large and bulky with insufficient transmission sensitivity and bandwidth for optimal use with implanted sensors. High transmission sensitivity and large bandwidth are desirable characteristics because they provide more accurate and efficient communication between the external unit and the implanted sensor. Other physical characteristics such as low profile and light weight also are desirable characteristics in such applications, because the transducer may be attached to or worn on or in the human body. Thus, there is a need in the art for an electroacoustic transducer having such advantageous physical characteristics.

SUMMARY OF THE INVENTION

The present invention relates to an electroacoustic transducer device and manufacturing process. The electroacoustic transducer device of the invention is an acoustic transmitter that comprises a plurality of electroacoustic cells arranged in a substantially flat panel array. Each transducing component of the device is a cell that contains a "bilayer" comprising an active element and an inert base. The active element is preferably a piezoelectric disk. The inert base is a flexural plate that preferably is conductive and may be metallized on one side. In particular, each cell of the transducer device of the invention may include a piezoelectric disk attached to a flexural plate and connected to electric wires, to form a piezoelectric bilayer unit.

A rail layer comprises a layer of material forming a plurality of apertures, the location, shape and diameter of which correspond to the cells. The height of the rail layer defines the depth of a cell cavity. Rails, also referred to herein as walls, separate adjacent cells.

The transducer device of the invention has a first side that faces the body or environment towards which the ultrasonic waves are to be transmitted, and may also be referred to as the "front" of the device. The first side optionally includes a matching layer, which has a surface that comes into contact with, for example, the body. The transducer device has a second side, that in some embodiments comprises a backing layer attached to the rail layer. The backing layer may provide mechanical support and plate constraint. Without being bound by theory, the mass of the backing layer may facilitate absorption of the energy emitted towards the back side of the transducer. Reducing back-emitted energy will result in a more efficient device in that the ultrasonic energy is intended to be directional and will be directed towards the front of the device. The mass of the backing layer may help enlarge the frequency bandwidth of the pressure response transmitted towards the front of the device.

The materials and design of the transducer device allow the acoustic transmitter to achieve a higher transmission sensitivity across a larger bandwidth of sound frequency while advantageously maintaining a lower-profile and lighter weight than conventional electroacoustic transducers having the same surface area.

The transducer device has a broad range of applications. Because the electroacoustic transducer device is comparatively small and has a low planar stiffness, it is especially useful where close contact with the skin is desired, because the ultrasonic waves may be effectively transmitted into the body. In addition to applications such as a medical diagnostic device, the transducer device of the invention may also have in civil or military underwater application, for example, as Synthetic Aperture Sonar (SAR) underwater navigation, depth sounding, ocean mapping, and underwater communications.

One non-limiting exemplary application for the transducer of the invention is with implantable ultrasonic sensors, in particular ultrasonically excitable passive resonating sensors. Such ultrasonically excitable passive resonating sensors include a resonating element, such as a membrane, and operate without direct electrical input. The resonating element of the implanted sensor is energized by ultrasonic energy from outside the body, resonates at a frequency that varies as a function of a physiological variable of the measurement environment, and returns ultrasonic signals from which that resonance frequency may be calculated. Examples of ultrasonically excitable passive resonating sensors that may be used with the present invention are described in U.S. Pat. Nos. 5,619,997, 5,989,190, 6,083,165, 6,331,163, 7,415,883 and 8,162,839 to Kaplan, and U.S. Pat. No. 7,134,341 to Girmonsky et al., which are incorporated herein by reference in their entireties. Because it is operable with high transmission sensitivity throughout the bandwidths of the working frequencies of such sensors, the electroacoustic transducer device of the present invention is particularly suitable for interrogating an implanted ultrasonically excitable passive resonating sensor.

The acoustic transmitter of the present application may be used to generate from electric signals the ultrasonic waves that communicate with the remotely located—for example, implanted—resonating sensor, including low frequency ultrasonic signals for exciting the resonating element of the sensor, for example a vibrating membrane, with an exciting ultrasonic beam. The transducer device may also emit high frequency carrier waves to the sensor and/or receive the ultrasonic signals, for example reflected or modulated signals, from the sensor and convert them to electric signals for reading the sensor output. The acoustic device may have a wide acoustic field or a narrow acoustic field. Designing the transducer device to have a wide acoustic field permits ultrasonic excitation of a large area. A wide acoustic field is desirable where, for example, a Doppler shift method will be used to differentiate what is resonant and what is not and to determine the resonance frequency of an ultrasonically excitable resonating sensor, as described for example in detail in U.S. Pat. No. 7,134,341 to Girmonsky. Designing the transducer to have a narrow acoustic field is useful when one wants to steer the excitation field in a particular direction.

Thus, it is an object of the invention to provide a lightweight electroacoustic transducer having a low profile, yet high sensitivity, large frequency bandwidth, and a wide acoustic field.

The transducer may also be designed to have an excitation field that is more focused and therefore more steerable. Therefore, it also is an object of the invention to provide a lightweight electroacoustic transducer having a low profile, high sensitivity, large frequency bandwidth, and a narrow acoustic field.

It is also an object of the invention to provide a multi-element transducer having more than one operating range, in particular a multi-frequency transducer. The different frequency ranges may be operated independently or together.

The present invention also relates to the manufacturing process of the electroacoustic transducer, which involves producing an assembly of the flexural plate, a separate assembly of piezoelectric disk for the plurality of cells, and subsequently attaching the two assemblies together.

It is another object of the invention to provide a method for fabricating an electroacoustic transducer having a low profile, high sensitivity and a wide acoustic field.

It is yet another object of the invention to provide a method for fabricating an electroacoustic transducer having a low profile, high sensitivity and a narrow acoustic field.

The collective effect of the planar array of cells in accordance with the invention gives the transducer device the advantage of higher sensitivity operating over a larger bandwidth compared to single cell transducers. The construction of the transducer also provides a low profile and lightweight device with a flexible design that is relatively inexpensive to prototype. The transducer of the invention may be designed to provide an appropriate field strength, field width and frequency or combination of frequencies for a variety of applications.

BRIEF DESCRIPTION OF THE DRAWINGS

The present invention may be understood and appreciated more fully from the following detailed description taken in conjunction with the drawings, in which.

DETAILED DESCRIPTION OF THE INVENTION

Figure 1A:
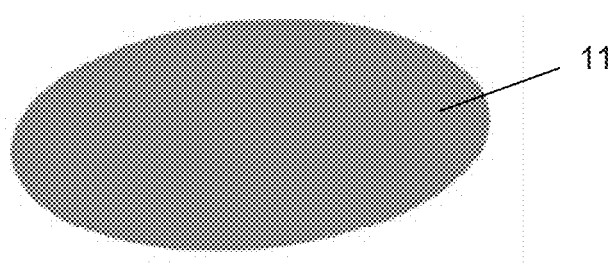
FIGS. 1A-1C illustrate the layers of an embodiment of the multi-celled transducer according to the invention, from an elevated perspective view.

The present invention provides a multi-cell electroacoustic transducer and a method of fabricating such a transducer. The electroacoustic transducer device of the invention is substantially flat, comprising a plurality of cells in a plane. The transducing component comprises a cell, and each cell may comprise a bilayer unit. Specifically, an array of piezoelectric disks may be attached to a flexural plate, tiled in a plane to provide a matrix of bilayer units (cells). Electrical input to the piezoelectric disks may be supplied via wires. The electro-acoustic cells convert electric signals to ultrasonic acoustic signals, which signals may be directionally emitted with minimal energy loss because of the design of the device. Through the collective effect of the plurality of cells, the transducer device may achieve high transmission sensitivity across a large bandwidth to provide a wide acoustic field. The array also allows for designs that enhance directional properties, which permits a concentrated beam of acoustic power.

Advantages of using a planar array of bilayer transducer components for the multi-cell transducer of the invention include high sensitivity, potential for large bandwidth, low profile, light weight, inexpensive prototyping for particular applications, and flexible transducer design. The advantageous large bandwidth of the present invention provides a transmission amplitude response that provides efficient acoustic transmission over a wide range of frequencies.

In particular, the bilayer transducing component of the transducer of the invention may comprise an inert base and a piezoelectric element. The bilayer array is divided into a plurality of cells, by a rail layer comprising rails that define a plurality of apertures, each aperture defining a cell cavity. The rails are also referred to herein as walls. Each cell has its own diameter defined by the rails, and each cell operates independently, but the plurality of cells may be driven in parallel. The rail layer may also have a vertical height that helps direct emission of acoustic energy from the transducer component bilayer.

The piezoelectric cells of the multi-cell transducer of the invention may have any rotationally symmetric shape (symmetry along an axis defined by the center of the cell). In one embodiment, the cells have identical shape and size. In one embodiment, the cells are round. In another embodiment, the cells are hexagonal. In yet another embodiment, the cells are square. The diameter of each cell, between the rails, may be of a dimension to obtain a desired frequency. For some embodiments, the diameter of the each cell may be between about 4-10 mm, for example 6 mm or 7 mm. The cells may be tiled so as to have identical distance from the center of any cell to the center of any adjacent cell, for example, hexagonal tiling. In one embodiment, the cell distribution may be one that provides the greatest packing density of the plurality of cells on the transducer disk, i.e., with minimal distance between the cells. Minimizing the width of the rails to decrease pitch (the distance between the center of adjacent cells) may provide increased bandwidth of working frequencies for a transducer device having a given diameter. When the cells are hexagonal, each rail may have an equal width. Thus, without being bound by theory, the transducer of the invention may be designed with a cell density that provides a desired power or power density per unit area.

The transducer device may further include a matching layer on a first side of the array and a backing layer on a second side of the array.

The transducer device preferably includes a matching layer. The matching layer is located on a first side of the transducer device—in particular, the "front" of the transducer, where ultrasonic waves are emitted from the device and received from the environment, whereas the backing layer is located on a second side of the transducer device. The matching layer is transparent to ultrasonic waves and preferably is constructed from a material that minimizes acoustic impedance mismatches as the acoustic waves cross the interfaces between the environment, matching layer and flexural plate. In other words, the acoustic impedance of the matching layer should be similar to that of the environment and flexural plate to minimize reflection or refraction of the acoustic waves and also minimize adverse effects on the strength, e.g., loss of acoustic energy, and frequency of the acoustic waves. When the transducer device is used with an implanted sensor as part of an external unit, for example to excite the sensor, and optionally to receive signals from the sensor, or to locate a sensor, it is preferred that the material of the matching layer has an acoustic impedance that approximates that of soft body tissues. Thus, for example, in such applications the matching layer may have an acoustic impedance similar to one or more of water, tissue, or blood, for example in the range of 1.5-1.54 MRayls. Determining the acoustic impedance of the environment in which the transducer is to be used is within the skill in the art. In medical diagnostic applications, the matching layer may have direct contact with the skin. Accordingly, the matching layer may comprise a soft polymeric material, and may be biocompatible with the body surface that it is intended to contact.

The backing layer may be attached to the rail layer—the second side of the device, effectively "sealing" the cavities to form closed cells. An advantage of including a backing layer is to limit acoustic energy transmission from the back of the device—a direction opposite that intended, which is less efficient and may change the bandwidth of the device. Appropriate materials for the backing layer will depend in part on the frequencies of acoustic energy being used and the general structure of the transducer.

The transducer may be designed to generate and receive low frequency ultrasonic waves or, for non-medical applications, sonic waves. The low frequency waves may be, for example, in the range of about 30-200 kHz, about 20-160 kHz, about 30-100 kHz, about 50-100 kHz, or about 20-80 kHz, or may include frequencies down to 10 kHz or as low as the particular application demands. It is generally preferable to avoid audible frequencies for human medical applications. Alternatively, the transducer may be designed to generate and receive high frequency ultrasonic waves, for example, in the range of about 1-10 MHz or about 1-50 MHz. Alternatively, the transducer may be designed to generate and receive a combination of low and high frequency ultrasonic (or sonic) waves, for example, combinations in the range of about 30 kHz to about 1 MHz or about 20 kHz to about 10 MHz.

The multi-cell design of the invention has been found to produce higher transmission sensitivity compared to conventional electroacoustic transducers with the same surface area. For example, the multi-cell design, when used within a frequency range of about 30-200 kHz, is especially suitable to be used with a passive ultrasonically excitable resonating sensor.

The apparatus/method of the invention is discussed and explained below with reference to the accompanying drawings. Note that the drawings are provided as an exemplary understanding of the present invention and to schematically illustrate particular embodiments of the present invention. The skilled artisan will readily recognize other similar examples equally within the scope of the invention. The drawings are not intended to limit the scope of the present invention as defined in the appended claims.

Figure 1B:
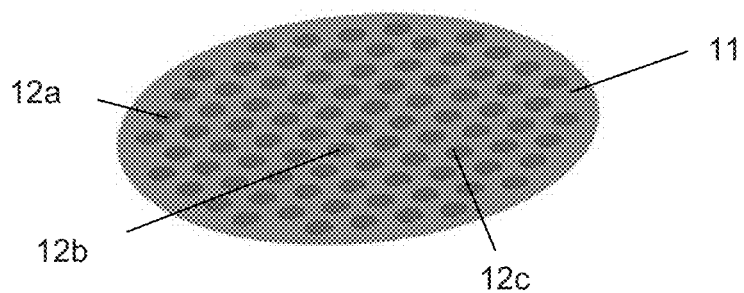
Figure 1C:
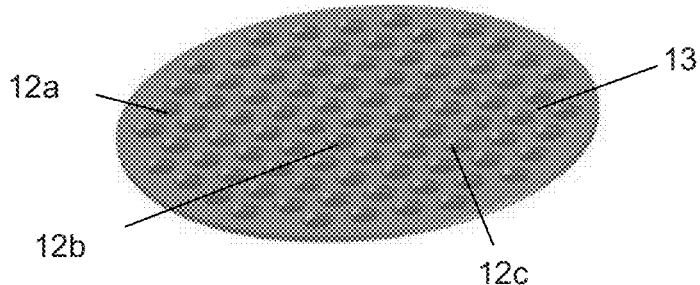

As illustrated in FIGS. 1A-1C, in a perspective view from below, the transducer device has as its essential elements a flexural plate 11, a plurality of piezoelectric elements, piezoelectric disks 12a-12c, disposed in a planar array on the flexural plate 11, and a rail layer 13. The array of bilayer elements—the active piezoelectric disks 12a-12c, coupled to the inert flexural plate—comprise the transducing component of the device.

As shown in FIG. 1A, the flexural plate 11 spans the entire area of the transducer. In particular, the flexural plate 11, shown in FIG. 1A, is the inert base upon which an array of piezoelectric disks 12a-12c are attached. FIG. 1B.

Generally, the inert flexural plate 11, 111 and piezoelectric disk 12, 112 layers of the bilayer 120 (FIG. 2) will have not only similar mechanical characteristics but also similar thickness (height in the vertical direction). Thus, for example, a 0.2 mm piezoelectric disk may be paired with a 0.2 mm flexural plate. As used herein, the terms "height" or "vertical height" are used interchangeably with "thick" or "thickness". In one embodiment, the mechanical characteristics of the flexural plate 11, 111 and piezoelectric disk 12, 112 are similar in that the Young's modulus of the flexural plate and the piezoelectric disk materials is of the same order of magnitude in order to achieve a low stress at the interface during flexural deformation of the entire transducer device. One can compensate for the difference in the Young's modulus by acting on the thickness, also referred to herein as vertical height, of the two layers. For example, if the flexural plate is formed of stainless steel and the piezoelectric disk is formed of PZT-5H, the Young's modulus is 190 and 61 GPa, respectively. In order to have a perfectly balanced structure, in one embodiment, the flexural plate and piezoelectric disk of each bilayer have similar mechanical characteristics and vertical height, e.g., the flexural plate may be formed with a thickness equal to or approximately 140 µm and the piezoelectric disk may be formed with a thickness equal to or approximately 200 µm. In this embodiment, the flexural plate and piezoelectric disk both have an identical Young's modulus. The flexural plate and piezoelectric disks may have one or more identical mechanical characteristics. In another embodiment, both the flexural plate and piezoelectric disk may be formed with an identical thickness, or vertical height, of 200 µm. It is envisioned that the flexural plate and piezoelectric disk can be formed with a plurality of alternate dimensions as long as a 1-to-4 ratio for the Young's modulus is maintained. The term similar as used herein encompasses any dimensions for the flexural plate and piezoelectric disk as long as a 1-to-4 ratio for the Young's modulus is maintained.

The flexural plate 11 may be a conductive plate (for example, metallized on at least one side) and may be manufactured from any material that is commonly used in conjunction with a piezoelectric material. The following criteria should be considered when selecting a material for the flexural plate: conductivity, ability to adhere to piezoelectric materials, thickness control, cost, and availability. Thus, for example, the flexural plate material should be able to reliably adhere to the material of the piezoelectric disk, for example to ceramics if a piezoceramic disk is used in the bilayer. Additionally, a material that provides precise thickness control is also preferred. Exemplary, non-limiting materials useful for a flexural plate according to the invention include carbon steel (for example, grade 1.1274 carbon steel); stainless steel (for example, grade 1.4310 stainless steel); alumina (for example, metallized alumina); glass (for example, metallized glass); and silicon.

The piezoelectric disk 12 may be manufactured from any material that is commonly used for its piezoelectric effects. The following criteria should be taken into consideration when selecting a material for the piezoelectric disk: mechanical characteristics (e.g., high piezoelectric constant $d_{31}$, low mechanical loss, low electrical loss), electrical characteristics (conductivity), shape and size, technical reliability, cost, and availability. Non-limiting exemplary materials for the piezoelectric disks include lead zirconium titanate (PZT), for example soft PZT materials, such as PZT5A and PZT5H, and hard PZT materials, such as PZT4, PZT7A, PZT8. PZT5A is described, for example, in Engineering Fundamentals, Inc. at www.efunda.com; PZT5H is described, for example, in Heinonen, E., Juuti, J., and Leppavuori, S. Characterization and modelling of 3D piezoelectric ceramic structures with ATILA software. *Journal of European Ceramic Society*, 25, 2467-2470 (2005). Such materials are available, for example from Boston Piezo Optics Inc., Bellingham, Mass., USA, which describes the properties of the materials at http://bostonpiezooptics.com/ceramic-materials-pzt. See also Bar-Chaim, N., M. Brunstein, J. Grünberg, and A. Seidman, "Electric field dependence of the dielectric constant of PZT ferroelectric ceramics," J. Appl. Phys. 45, 2398 (1974); D. Berlincourt and H. H. A. Krueger, (revised by C. Near), PROPERTIES OF MORGAN ELECTRO CERAMIC CERAMICS, Technical Publication TP-226, Morgan Electro Ceramics, available at http://www.morganelectroceramics.com/resources/technical-publications/; Berlincourt, D., "Recent Developments in Ferroelectric Transducer Materials," Transactions of the IRE Professional Group on Ultrasonic Engineering, Vol. 4, Issue: 1, pp. 53-65, August 1956; Berlincourt, D.; B. Jaffe, H. Jaffe, H. H. A. Krueger, "Transducer Properties of Lead Titanate Zirconate Ceramics," IRE Transactions on Ultrasonic Engineering, Volume: 7, Issue: 1, pp. 1-6, February 1960; Jaffe, H., D. A., Berlincourt, "Piezoelectric transducer materials," Proceedings of the IEEE, Volume: 53, Issue 10, pp. 1372-1386, October 1965; Lamberti, N., M. Pappalardo, "A general approximated two-dimensional model for piezoelectric array elements," IEEE Transactions on Ultrasonics, Ferroelectrics and Frequency Control, Vol. 42, Issue: 2, pp. 243-252, March 1995.

The rail layer 13 is attached to the flexural plate 11 and comprises a plurality of apertures, that correspond to the plurality of cells of the multi-cell transducer, as illustrated in FIG. 1C. The rail layer 13 material surrounding the apertures forms rails, or walls, between the cells thereby defining the boundaries of the bilayer electroacoustic cells. In the most efficient embodiments, the apertures are identically sized and equally spaced. As illustrated in more detail in FIGS. 2 and 3, each aperture defines a cavity 115a, 115b bounded by the flexural plate 111 and rails 113, the rails defining the walls of the cells 10, 10a, 10b. Each piezoelectric disk 12a-12c is attached to the flexural plate 11 (FIG. 1B) and is located centrally within the apertures of the rail layer 13 (FIG. 1C) i.e., within each cavity. Each piezoelectric disk 12a-12c, 112, 112a, 112b may have the same shape as the boundary of the cell 10, 10a, 10b in which it is contained, but a smaller diameter, as illustrated in FIGS. 2 and 3. With electric wires connected, the piezoelectric unit—the cell—can convert electric signals to ultrasonic waves and vice versa.

The piezoelectric element may actuate the flexural plate, causing it to flex. In one embodiment, the piezoelectric disk may be a piezoceramic plate, similar to those used in telephone receivers and buzzers. Current technology permits manufacture of such piezoceramic plates to a thinness of about 0.1 mm. The total thickness of the composite bilayer plate may be on the order of about 0.2 mm. Thus, when a voltage is applied, the composite plate may have large strain and low flexural stiffness. The presence of the flexural plate prevents radial vibration of the piezoceramic when an AC current is applied. The asymmetric stresses produced thereby are forced into the bilayer plate causing it to flex.

Without being bound by theory, a first approximation of the resonance frequency of the flexural plate of the cell is given by:

$$f = \frac{2 \cdot \lambda^2}{\pi \cdot d_c^2} \cdot \sqrt{\frac{E \cdot t^3}{12 \cdot (1 - \bar{v}^2) \cdot \bar{\rho}}} = \frac{2 \cdot \lambda^2}{\pi \cdot d_c^2} \cdot \sqrt{\frac{D}{\bar{\rho}}}$$

where t is the thickness (vertical height), $d_c$ is the diameter of the bilayer, $\bar{E}$ is the Young's modulus, $\bar{v}$ is the Poisson ratio, and $\bar{\rho}$ is the weight to surface ratio. The quantities indicated with overline are average values between that of the piezoelectric disk and the flexural plate. The constant $\lambda^2$ will depend on the resonance mode and the kind of bond employed to attach the piezoelectric disk to the flexural plate. See Caliano, G., A. Iula, N. Lamberti, M. Pappalardo, "A Piezoelectric Bimorph Static Pressure Sensor," Sensors & Actuators A, 46-47, pp. 176-178 (1995). For the first flexural mode, $\lambda^2$ may vary from about 4.9, for a plate supported on the border, to about 10.2 for a clamped plate.

In one embodiment, the element of the multi-element transducer may have different operating ranges and may be operated by separate cables and electronics. Such an arrangement provides a multi-frequency transducer that permits cells of each resonance frequency range to be operated either independently or in conjunction with one another. This embodiment may be advantageous for certain applications, such as for example acoustic vibrometry, where two frequencies, for example a lower frequency for excitation and a higher frequency for Doppler interrogation, are indispensable. The two separate frequency ranges can be operated from the same source with coaxial propagation through the media thereby insuring that the volume of the environment being interrogated is optimally placed over the volume of the environment being excited.

In this multi-frequency multi-transducer embodiment, groups of cells may be designed to vibrate at different frequencies. For some applications, the cells with the same frequency ranges may be equally distributed across the transducer amongst cells with different frequency ranges. For other applications, the cells with the same operating frequency range may be clustered, or placed in particular areas, of the transducer.

Figure 2A:
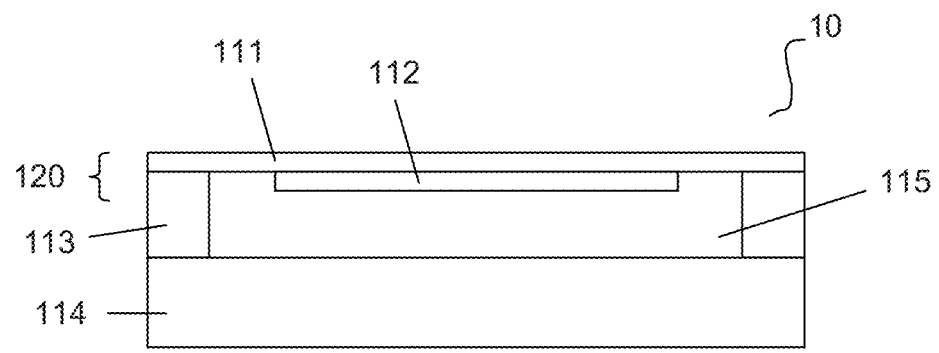
FIG. 2A is a schematic illustration of one piezoelectric cell, shown in cross-section, in accordance with the invention.
Figure 3:
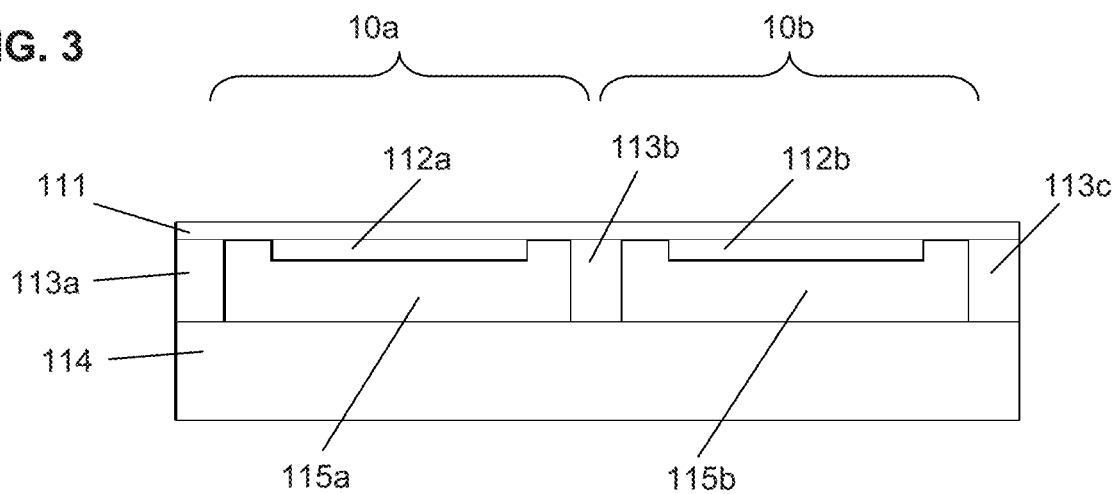
FIG. 3 is a schematic illustration of two adjacent piezoelectric cells, according to the invention, shown in cross-section, in accordance with the invention.

FIG. 2A schematically illustrates a cross-section view of one cell 10 of an embodiment of the transducer device of the invention. In this embodiment, the cell 10 includes the bilayer 120 of a flexural plate 111 and a piezoelectric disk 112, as well as rails 113 that define the cell boundaries and a backing layer 114 that closes the cavity 115 defined between the rails 113, flexural plate 111 and backing layer 114.

Figure 2B:
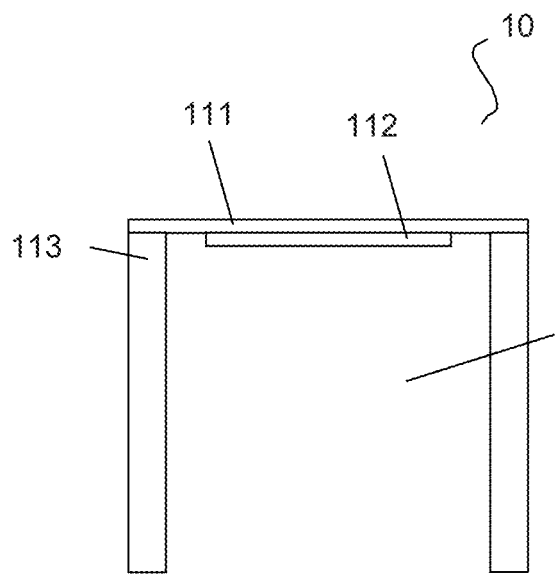
FIG. 2B is a schematic illustration of another piezoelectric cell, shown in cross-section, in accordance with the invention.

FIG. 2B schematically illustrates a cell 10 of an embodiment comprising a tall rail layer and no backing layer.

Figure 2C:
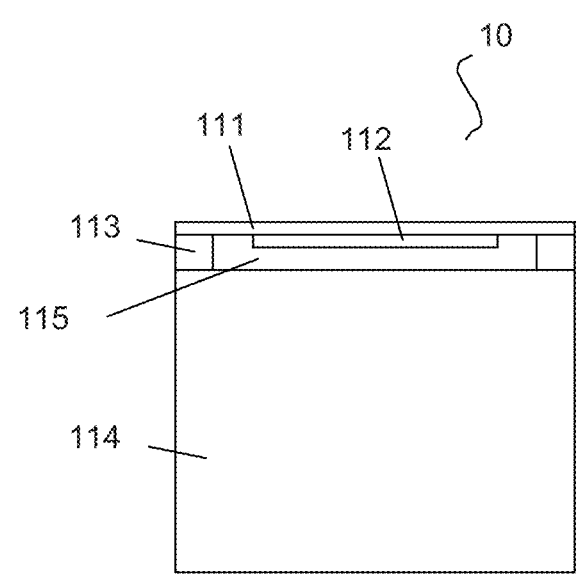
FIG. 2C is a schematic illustration of another piezoelectric cell, shown in cross-section, in accordance with the invention.

FIG. 2C schematically illustrates a cell 10 in which the rail and backing layers are made of the same material.

FIG. 3 schematically illustrates in cross section how the rails 113a, 113b, 113c define the borders of two adjacent cells of an embodiment of the transducer device of the invention. This embodiment is similar to that depicted in FIG. 2A, comprising a flexural plate 111, piezoelectric disks 112a, 112b, and a backing layer 114 that closes cavities 115a and 115b of each cell. FIG. 3 also illustrates that each piezoelectric disk 112a, 112b has a diameter smaller than the diameter of the cell 10a, 10b containing it.

Figure 5:
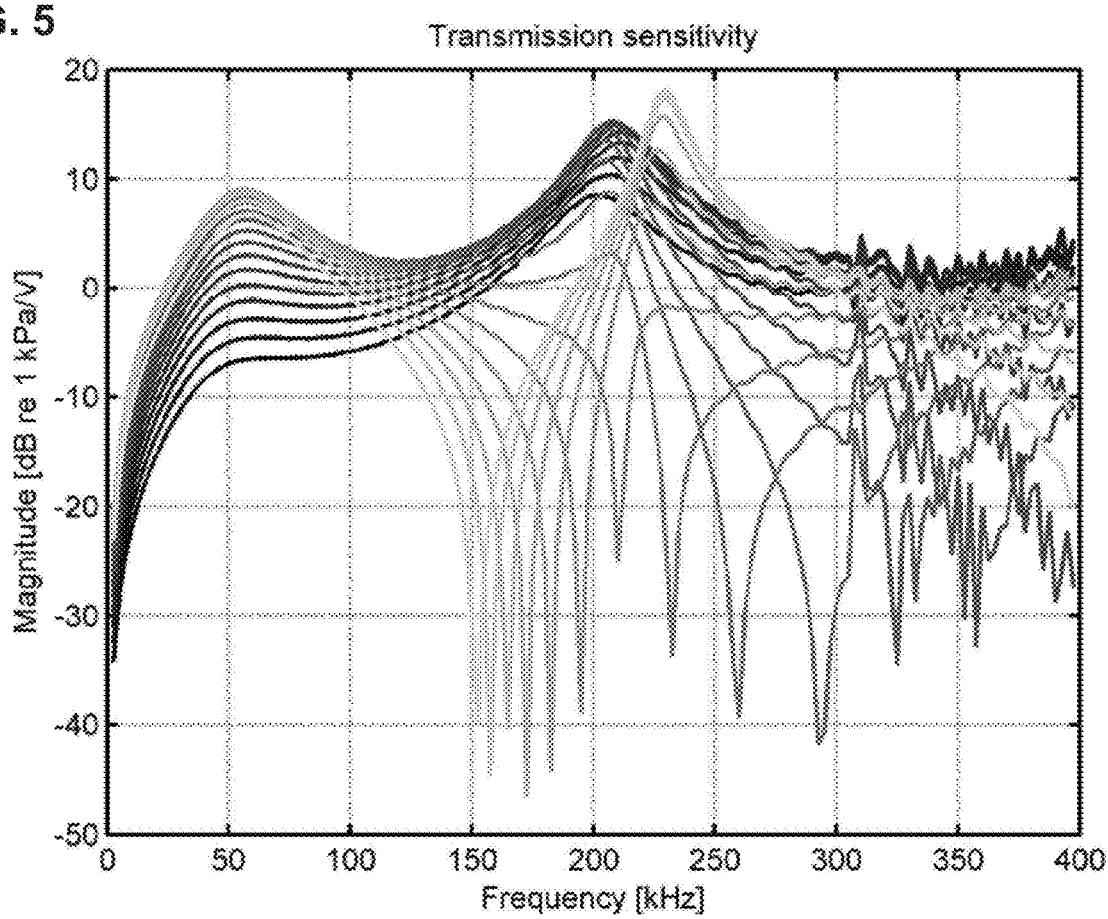
FIG. 5 illustrates transmission sensitivity for a single piezoelectric cell as a function of disk-to-plate diameter ratio.

In this embodiment, piezoelectric disks 12a and 12b are identical and each has a diameter of d1. The diameter of cells 10a and 10b, the flexural plate between the rails 13a, 13b and 13c, is d2. The d1:d2 ratio (disk:plate) may be in the range of 0.5 to 1. When d1 is 5 mm, for example, d2 may be 6 mm. Such a cell, having a d1:d2 ratio of 5:6 (or 0.83), achieved a high transmission sensitivity of approximately 85%, as illustrated in FIG. 5. The width of the rails (d3) will affect the cell-cell distance (d4), which is measured from the center of a cell 10a to the center of an adjacent cell 10b. Thus, designing a rail layer having a small d3 will allow for a smaller d4 for the planar array of cells. In one embodiment, for example, d3 may be 1 mm.

Figure 4:
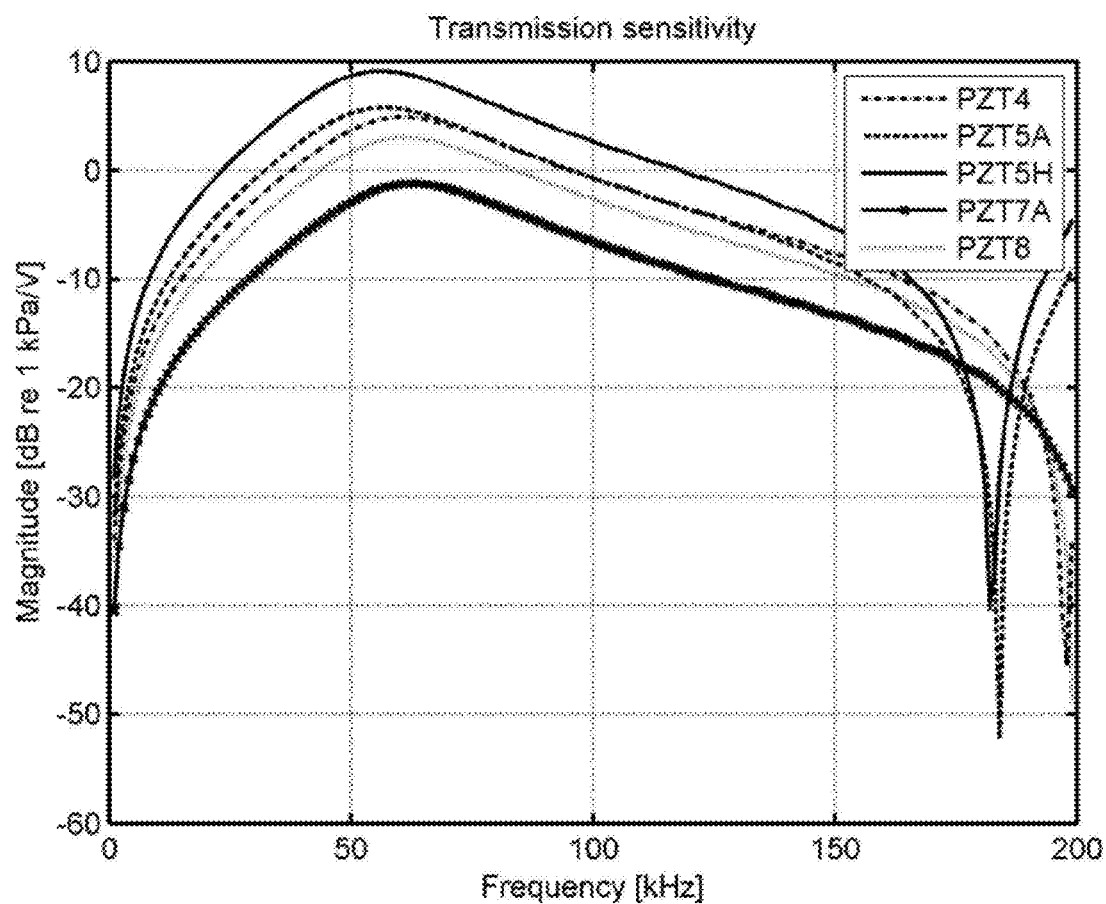
FIG. 4 illustrates transmission sensitivity for a single piezoelectric cell as a function of frequency for various PZT materials.

As illustrated in FIG. 4, amongst various materials evaluated for the piezoelectric disk of the invention (PZT4, PZT5A, PZT5H, PZT7A and PZT8), for a single cell embodiment, PZT5H provided the highest d31 (transverse piezoelectric coefficient, also referred to as piezoelectric strain). The embodiments of transducer cells used to generate the data for FIG. 4 and other data presented herein included a bilayer comprising a flexural plate manufactured from grade 1.1274 Carbon steel, which is available from, for example, Hasberg Schneider GmbH, Bernau, Germany.

The embodiments of transducers used to generate the data for FIGS. 5, 6A, 6B, 9-11, 12 and 13A-D included a bilayer comprising a piezoceramic manufactured from PZT5H and a flexural plate manufactured from grade 1.1274 Carbon steel.

As noted above, the piezoelectric disk may have a diameter (d1) smaller than the diameter of the cell (d2) in which the plate is contained. The cell, or plate, diameter (d2) is the diameter of region of the flexural plate for the bilayer unit of the transmission sensitivity obtained for range of d1:d2 ratios for a single cell according to the invention are illustrated in FIG. 5. In an embodiment comprising a piezoelectric disk plate manufactured from PZT5H, a d1:d2 ratio of 5:6 provided advantageous acoustic frequencies up to about 160 kHz.

Figure 6A:
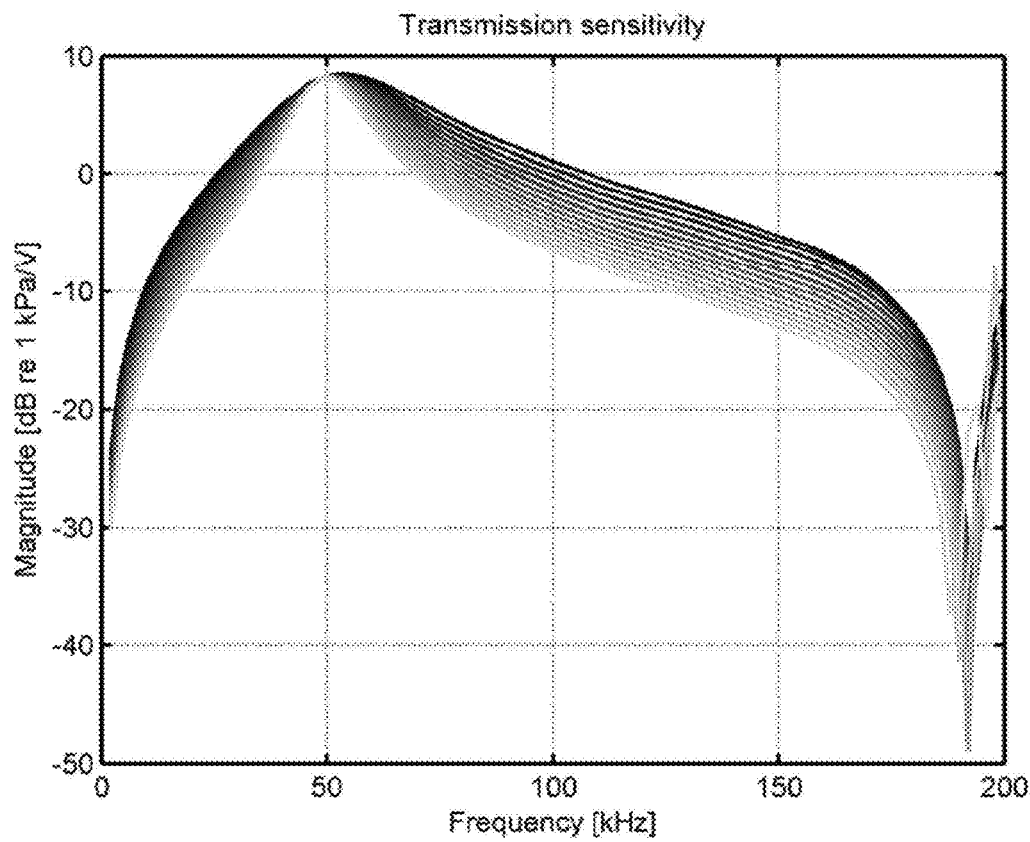
FIG. 6A illustrates transmission sensitivity for a single piezoelectric cell as a function of pitch.
Figure 6B:
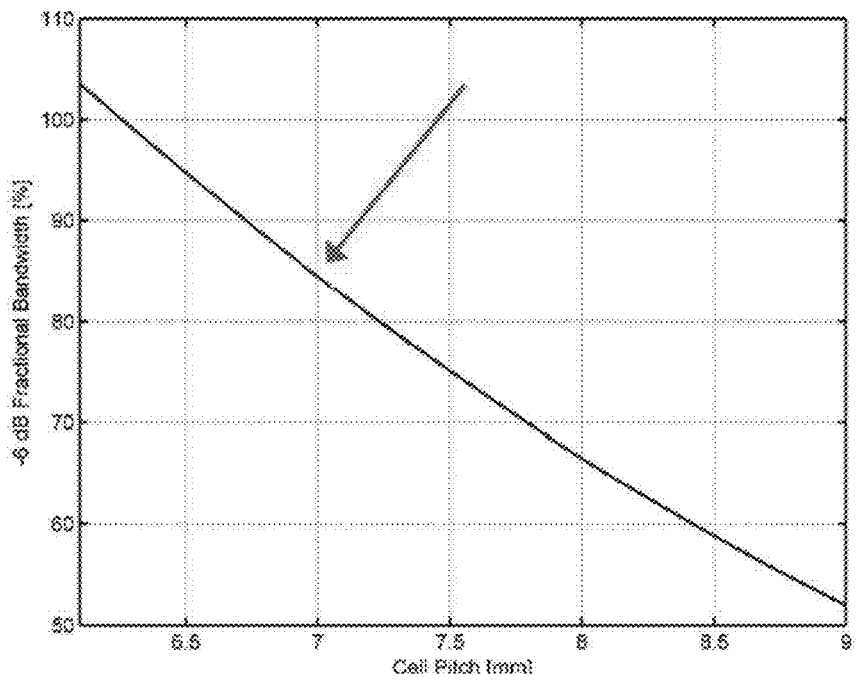
FIG. 6B illustrates the correlation between pitch and transmission sensitivity for a single piezoelectric cell.

The distance between the centers of adjacent cells (cell to cell distance) is referred to as "pitch." The transmission sensitivity over a range of pitches was assessed for a single cell, and is shown in FIG. 6A. As depicted in FIG. 6B, the frequency bandwidth and the pitch value are inversely proportional. Circular cells may be arranged in a hexagonal tiling pattern. Alternatively, hexagonal cell shapes may be used. A circular or hexagonal cell shape permits closer spacing between cells than, for example, a square shape. An 80 mm diameter disk may have between 120-150 hexagonal or circular cells. In one embodiment having circular cells in a hexagonal array, it was determined that a pitch of 7 mm can provide an 85% fractional bandwidth. Other pitches may be used, taking into account the shape of the cells, with the aim of achieving as close to 100% fractional bandwidth as possible. Smaller pitch values may improve bandwidth, but at the expense of a larger number of cells, requiring more piezoelectric material and thus higher cost.

An advantage of the transducer of the invention is that it is not limited to a particular diameter or geometry or combination thereof, so that the optimal combination of acoustic power and frequency range or ranges may be obtained. Thus, for example the transducer may be designed to penetrate to a particular depth, for example through tissue, and have particular field width and a particular working frequency range or ranges, depending on the application.

Figure 7:
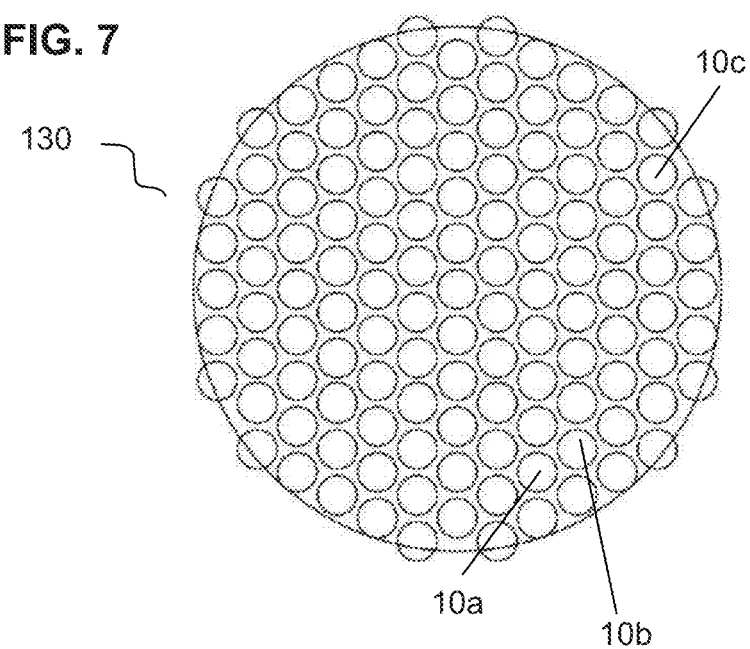
FIG. 7 illustrates an embodiment of a cell layout design for a multi-cell transducer according to the invention—a solid disk.
Figure 8A:
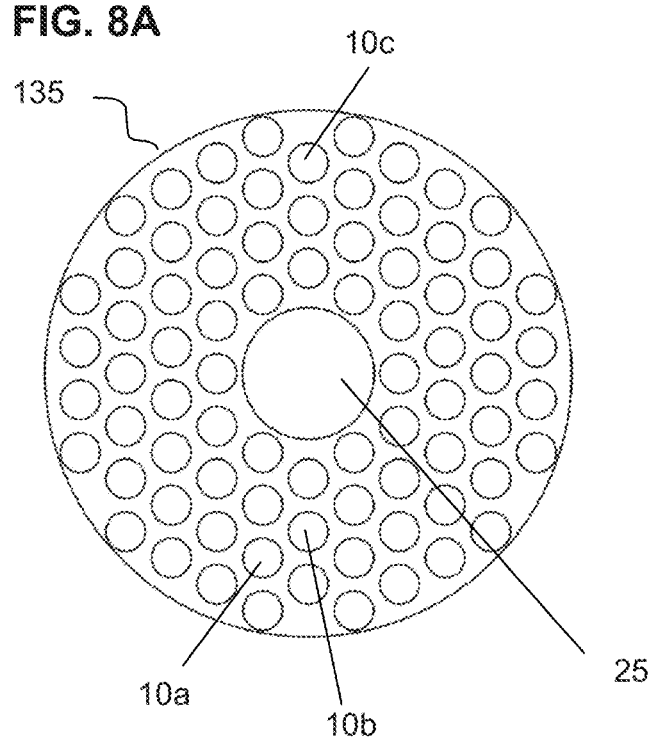
FIGS. 8A and 8B illustrate embodiments of a cell layout design for a multi-cell transducer according to the invention—a disk with a central hole (opening), the embodiment of FIG. 8B having a larger disk diameter, and therefore more cells, than the embodiment of FIG. 8A.
Figure 8B:
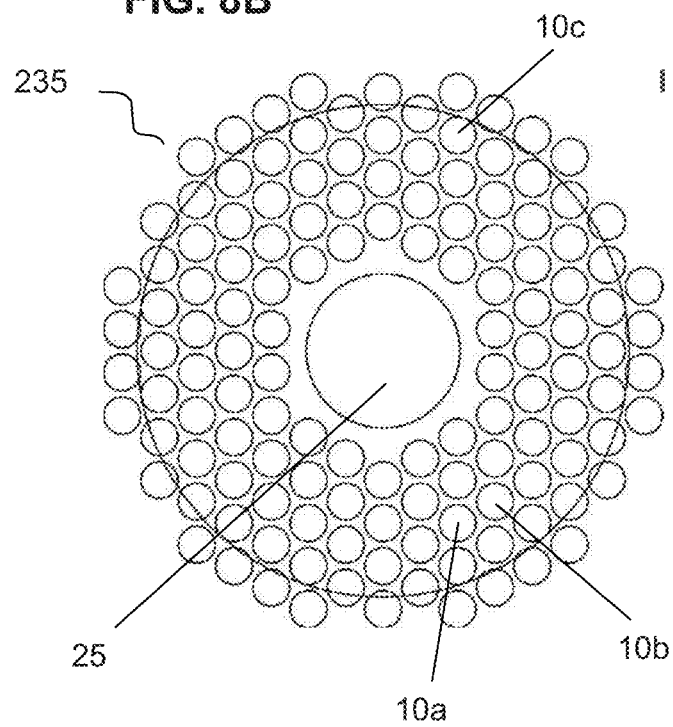

The transducer may have any planar geometric shape, however a generally round or circular shape—a disk has been found to provide efficient tiling of the cells. The disk may be solid, as illustrated in FIG. 7 or may include a central hole—like a "donut hole", as illustrated in FIGS. 8A and 8B. Non-limiting examples of the composite disk diameter may be between about 30-90 mm, between about 50-100 mm, or between about 60-90 mm, for example 80 mm diameter or 92 mm diameter. The central hole may have a diameter of between about 10-30 mm, for example about 25 mm. The thickness of the disk may be between about 5-40 mm, for example 15 mm thick, including the rails, a backing layer, and a matching layer. Without a backing layer, the thickness of the disk may be between about 1.5-40 mm. The bilayer layer may have a thickness of between about 0.2-1 mm, for example 0.4 mm. Depending on the particular application, disk diameters larger than 100 mm are well within the scope of the invention. The appropriate diameter (lateral dimension), and the relative dimensions of the other structures, are within the scope of the art based on the disclosure herein.

Two modeling methods may be used to evaluate the electrical impedance and radiated pressure field for prototypes of cell arrays in accordance with the invention. For example, Finite Element Modeling (FEM) may be used assess impulse responses, i.e., the time-domain acceleration response of the transducer to a voltage impulsive excitation. The FIELD II model (see http://field-ii.dk/?./downloading_7_12.html; see also J. A. Jensen. "Field: A program for simulating ultrasound systems." *Med. Biol. Eng. Comp.*, 10th Nordic-Baltic Conference on Biomedical Imaging, Vol. 4, Supplement 1, Part 1:351-353, 1996b) permits calculation of the radiated pressure field generated by arbitrarily shaped transducers of finite size in the medium for sinusoidal continuous or pulsed waves.

In one embodiment, a low frequency electroacoustic transducer in accordance with the invention will have a 6 dB fractional bandwidth that approaches 100% and a sensitivity that is high enough to obtain 100 kPa using driving signals with an amplitude of tens of volts within the desired frequency range, for example 30-100 kHz (−6 dB) in a cylindrical volume of interest having length of approximately 160 mm and a diameter of approximately 40 mm.

Exemplary layouts of planar cell arrays on transducer disks having different shapes were designed as illustrated in FIGS. 7, 8A and 8B, and the electrical impedance in immersion (FEM) of the transducer embodiments were evaluated. In these non-limiting embodiments, each cell has a minimum diameter of 6 mm, and each rail has a minimum width of 1 mm.

FIG. 7 illustrates one embodiment of a transducer 130 having a solid disk shape and how the planar array of cells 10a-10c may be arranged. In this non-limiting example, the transducer disk 130 has an outer diameter of about 80 mm, which permits a planar array of approximately 121 circular cells, each having a 6 mm diameter. The capacitance (C) of the embodiment of FIG. 7 at 1 kHz was 245.7 nF and the impedance (Z) was 1.82-21.2 i Ω at 30 kHz, 2.79-12.48 i Ω at 60 kHz, and 0.33-8.06 i Ω at 100 kHz. The electrical impedance angle was determined to be close to −90 degrees; losses were mainly due to acoustical energy radiation. In another embodiment, the transducer disk has an outer diameter equal to or approximately 120 mm.

FIG. 8A schematically illustrates another embodiment of a planar array of cells 10a-10c in an embodiment of a transducer 135 having a donut shape. In this non-limiting example, the transducer disk 135 has an outer diameter of about 80 mm and an inner (central hole) diameter of about 25 mm, which permits approximately 90 circular cells having a 6 mm diameter. For the embodiment of FIG. 8A, the following capacitance and impedances were measured: C=182.8 nF at 1 kHz, and Z=2.46-28.57 i Ω at 30 kHz, 3.75-16.79 i Ω at 60 kHz, and 0.44-10.84 i Ω at 100 kHz.

FIG. 8B schematically illustrates how the planar array of cells 10a-10c may be arranged in another embodiment of a transducer 235 having a central hole. In this non-limiting example, the transducer disk 235 has a larger outer diameter of about 92 mm and inner diameter of about 30 mm. This design permits a planar array of approximately 132 circular cells having a 6 mm diameter. For the embodiment of FIG. 8B, the following capacitance and impedances were measured: C=268.1 nF at 1 kHz, and Z=1.67-19.48 i Ω at 30 kHz, 2.56-11.44 i Ω at 60 kHz, and 0.30-7.39 i Ω at 100 kHz.

Figure 9:
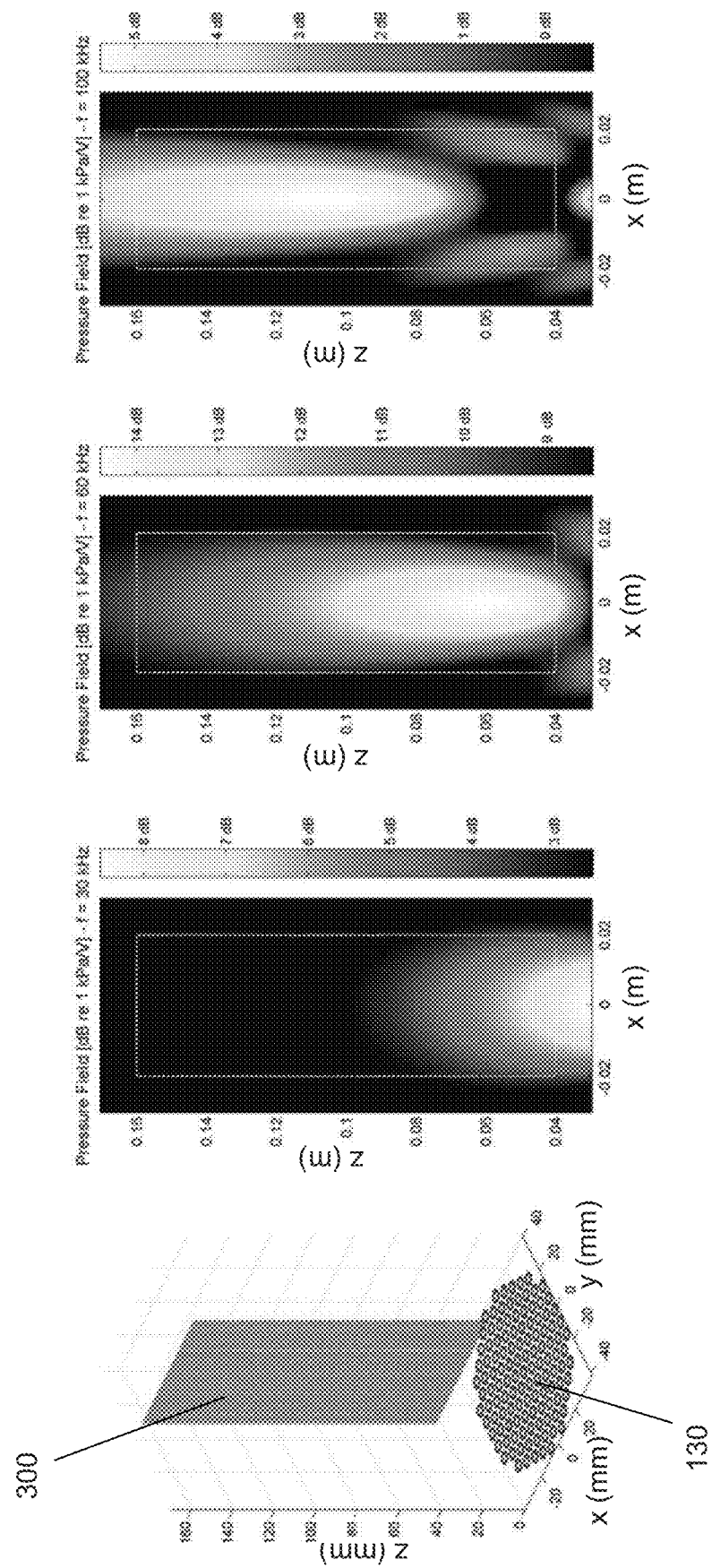
FIG. 9 illustrates the beam patterns at different frequencies for an electroacoustic design embodiment like that shown in FIG. 7.
Figure 10:
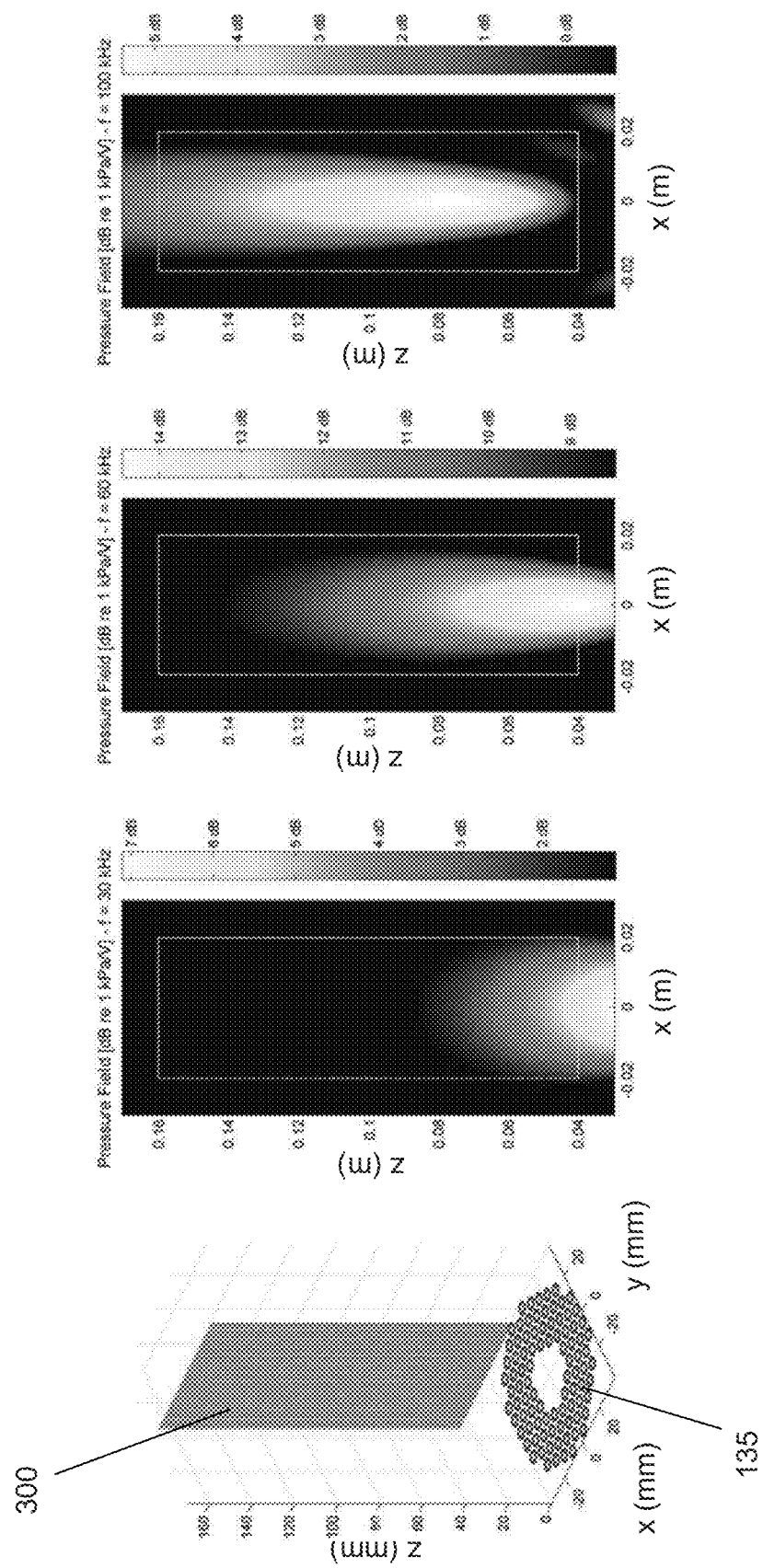
FIG. 10 illustrates the beam patterns at different frequencies for an electroacoustic design embodiment like that shown in FIG. 8A.
Figure 11:
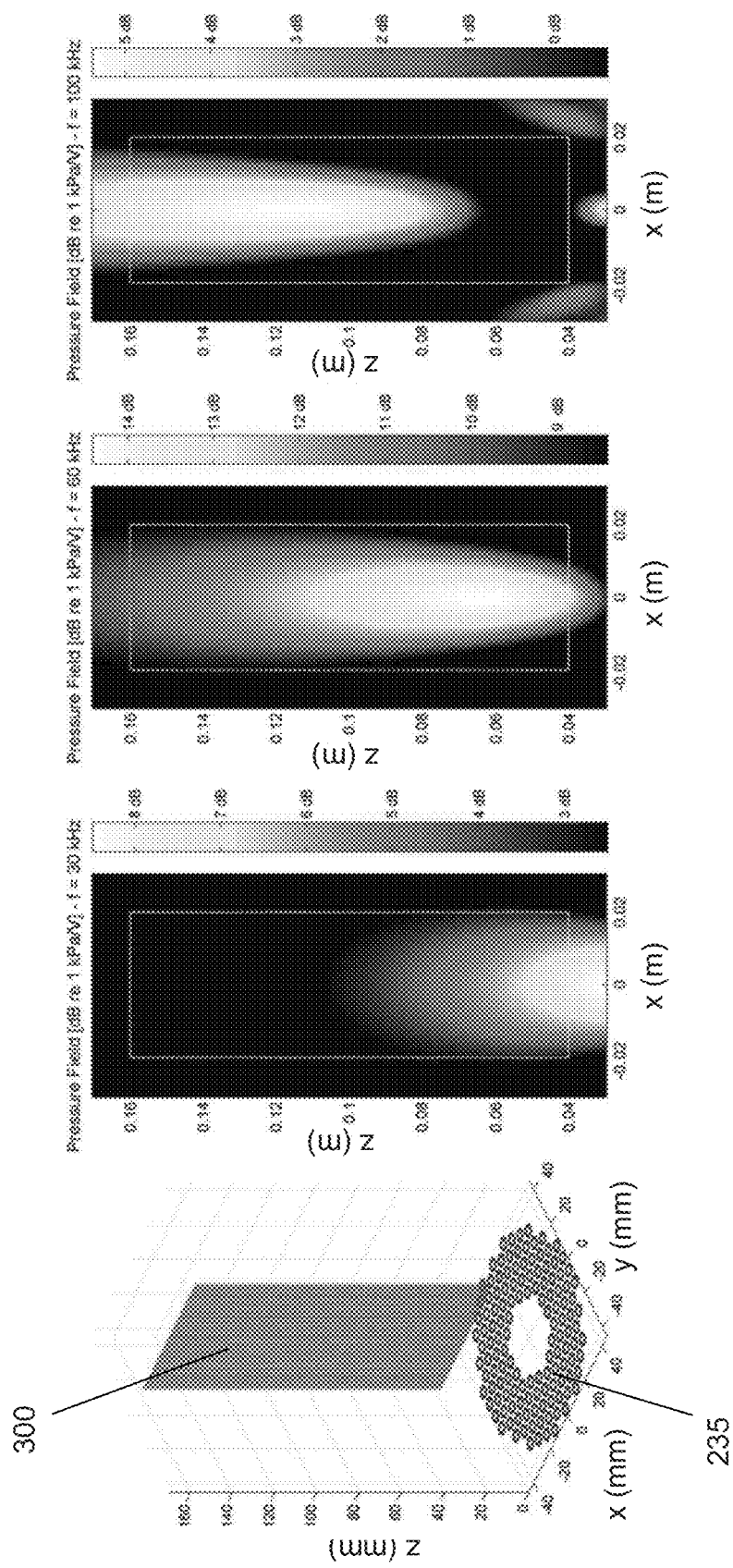
FIG. 11 illustrates the beam patterns at different frequencies for another electroacoustic design embodiment like that shown in FIG. 8B.

The embodiments of FIGS. 7, 8A and 8B were tested in a radiated pressure field (FIELD II) model for a 1 V sinusoidal continuous wave, and the field magnitude computed for a volume of interest 300 at three different frequencies (30 kHz, 60 kHz and 100 Hz). The results are depicted in FIGS. 9, 10 and 11, respectively. In each of FIGS. 9, 10 and 11, the acoustic volume of interest 300 is illustrated by a rectangle in the panel on the far right. The acoustic volume of interest 300 for these tests is a substantially cylindrical space of approximately 40 mm in diameter, and extending between about 40 mm to about 160 mm from the surface of the transducer device. Such a volume of interest is expected to provide a range of ultrasonic wave emission that may be appropriate for an external acoustic transmitter used in conjunction with an implanted ultrasonically excitable sensor. The data in FIGS. 9, 10 and 11 illustrate the ultrasonic field generated by the transducer for the embodiments at the tested frequencies. The magnitude of the ultrasonic waves at each of three frequencies is represented by color according to the bar on the right side of each diagram. The diameter of the ultrasonic waves at each of the three frequencies is represented on the x-axis.

FIG. 9 depicts the spatial field distribution (beam pattern) of ultrasonic waves of 30 kHz, 60 kHz and 100 kHz, respectively, emitted from the transducer device 130 of FIG. 7. FIG. 9 shows that at all three frequencies, ultrasonic waves of significant magnitude (about 5 dB) reach the acoustic field of interest.

FIG. 10 depicts the spatial field distribution (beam pattern) of ultrasonic waves of 30 kHz, 60 kHz and 100 kHz, respectively, emitted from the transducer device 135 of FIG. 8A. FIG. 10 shows that at all three frequencies, ultrasonic waves of significant magnitude (about 5 dB) reach the acoustic field of interest.

FIG. 11 depicts the spatial field distribution (beam pattern) of ultrasonic waves of 30 kHz, 60 kHz and 100 kHz, respectively, emitted from the transducer device 235 of FIG. 8B. FIG. 11 shows that at all three frequencies, ultrasonic waves of significant magnitude (about 5 dB) reach the acoustic field of interest. Comparison of FIGS. 11 and 10 illustrate how the number of cells in the planar array, albeit across a larger diameter disk, affects the acoustic field transmission.

Efficiency of the device may be enhanced by the particular design of the rail layer, backing layer and matching layer.

The matching layer is used not only to prevent electrical contact with a patient's body, but it is designed to acoustically match the transmitter to the measurement environment, e.g., bodily tissues, to maximize energy transfer. Thus, it is preferable to have a matching layer (not shown) having an acoustic impedance similar to whatever medium through which the ultrasonic waves are to be transmitted. Matching the acoustic impedance in this manner may minimize reflection, refraction and dissipation of the ultrasonic waves sent and received from the transducer device. Thus, for example, for applications in which the transmitter will emit and/or receive ultrasonic waves through soft body tissues, the matching layer may have an acoustic impedance similar to one or more of water, tissue, or blood, for example, in the range of 1.5-1.54 Mrayls, or in the range of about 1.2 to 1.72 Mrayls, or about 0.18 to 1.72 Mrayls. Determining the acoustic impedance of the environment in which the transducer is to be used is within the skill in the art. The matching layer is not required, however it is useful for damping possible resonance that may result from acoustic interactions between cells.

The matching layer, which may be made of hard or soft polymeric materials known in the art, may also include electrical insulation and provide cell-to-cell acoustic interaction damping. Non-limiting examples of such hard or soft polymeric materials include silicone-powder compounds, elastomers, and other suitable compounds that have an appropriate acoustic impedance. Silicone-nanopowder has an acoustic impedance of about 1.48 MRayl. The matching layer is also useful as a surface that contacts, for example, skin in medical diagnostic applications. Suitable biocompatibility may be desirable for such applications. One skilled in the art would know to choose appropriate materials for particular purposes, for example inert materials if the device is to be used in a corrosive environment.

A comparison of soft and hard polymeric materials having the same acoustic characteristics (plastics and rubber) using the FEM model revealed that hard materials were less favored than soft materials, because they tended to influence the flexural vibration modes of the cells. Soft materials having acoustic behavior more similar to fluids produced better results. A matching layer comprising a biocompatible silicone-nanopowder compound, and having an acoustic impedance of about 1.48 MRayl, was shown to produce very low acoustic energy loss. The thickness of the matching layer may be in the range of 1 to 20 mm.

Designing the transducer device with an appropriate combination of rail layer and backing layer structure and materials can be used to direct the acoustic energy waves and thereby limit acoustic energy loss. The backing layer not only provides mechanical support and plate constraint to the transducer, but also may be designed to absorb and damp the back-emitted energy i.e., acoustic wave traveling in a direction opposite of that intended—toward the front of the device. The particular design of the backing layer can affect the frequency band shape of the transducer device. Different combinations of materials and vertical height may be used to achieve the desired characteristics of the backing layer, taking into account the following parameters: the available space, broad band excitation requirements, and electrical interconnections. Non-limiting examples of materials of the rail layer and backing layer may include, for example, brass and plastics. Non-limiting exemplary plastics include epoxy and tungsten-filled epoxy.

Various combinations of rail layer and backing layer structures may be used in accordance with the invention to achieve the desired result. In one embodiment, the transducer device comprises a tall rail layer and the cavity is open, i.e., there is no backing layer. In another embodiment, the device may comprise a short rail layer and a tall backing layer; in such embodiments that include a backing layer, the cavity is isolated, i.e., closed. In yet another embodiment, having a closed cavity, the device may comprise a tall rail layer and a short backing layer. To maintain a low profile and lightweight device, the acoustic transmitter as a whole may have a thickness of less than 15 mm, for example, 10 mm or 11 mm. Thus, tall layers may be on the order of 8-10 mm, short layers may be on the order of 1-2 mm. Other combinations of heights and materials may be used, depending on the particular application, and may be determined by the person having ordinary skill in the art based on the present description.

Single cell prototypes of exemplary combinations of some of the above structural designs and materials were made and tested, the results of which are illustrated in FIGS. 12 and 13A-D.

Figure 12:
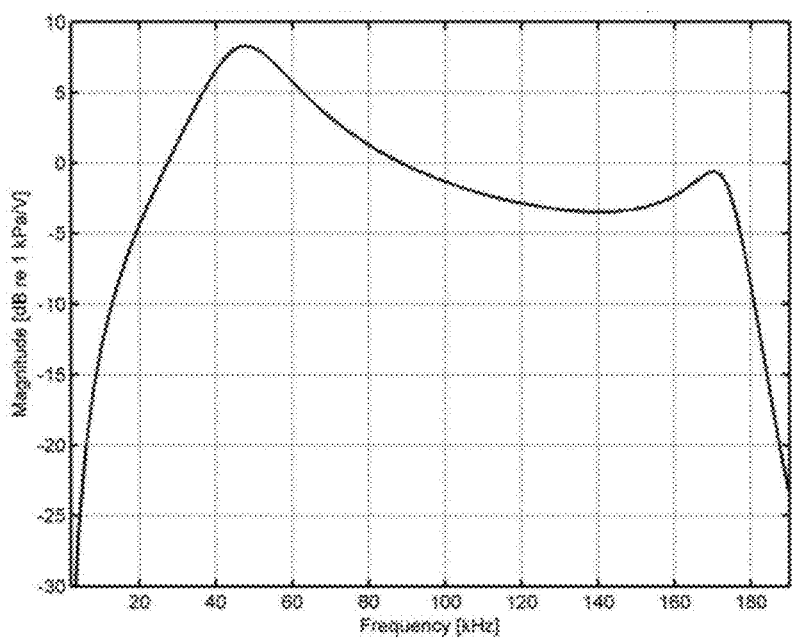
FIG. 12 is a transmission sensitivity chart for an embodiment of a cell having tall rails made of brass, for use in a transducer device in accordance with the invention.

FIG. 12 depicts FEM simulated transmission sensitivity of the simple structural design comprising a tall rail layer and no backing layer, as depicted in FIG. 2B. In this embodiment of the transducer device, the rail layer comprises brass and has a rail layer height of about 10 mm. The transmission sensitivity is unaltered in the band of operation, however there is a peaking at high frequency. Radiation pattern alteration is possible at certain frequencies due to radial modes of the rail structure that may be excited by the net pressure on the transducer surface during operation.

FIGS. 13A-D depict FEM simulated transmission sensitivity of an embodiment of the structural design having a short rail layer and tall backing layer, and various combinations of material.

Figure 13A:
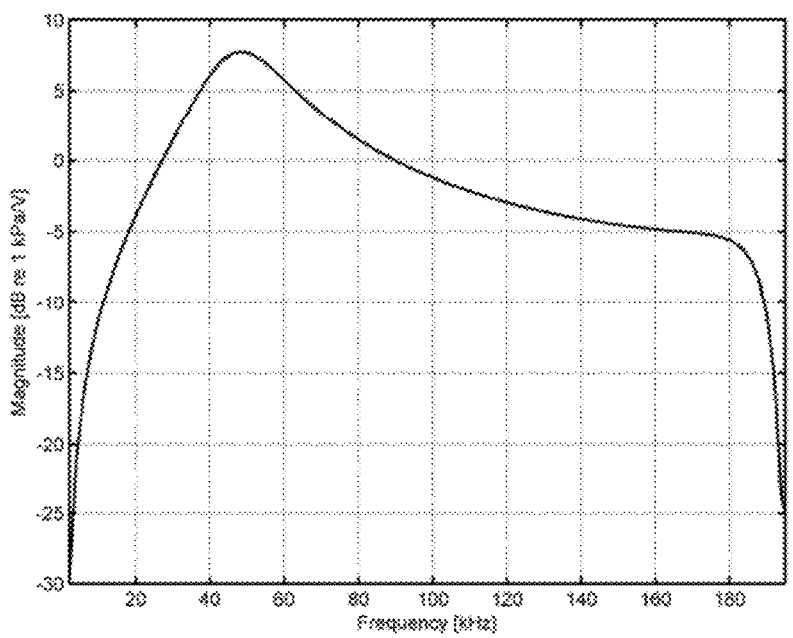
FIG. 13A is a transmission sensitivity chart for an embodiment of a cell having a backing layer that is thicker than the rail layer, for use in a transducer device in accordance with the invention, in which the rail and backing layers are both made of the same material, brass.

FIG. 13A depicts data from an embodiment of a cell in which the rail and backing layers are made of the same material, brass, as depicted in FIG. 2C. The rail layer height is about 1 mm, and the backing layer height is about 10 mm. The performance of this combination is good and transmission sensitivity is unaltered. Because of the excitation of the backing radial modes with this embodiment, it is possible to have a radiation pattern alteration at certain frequencies.

Figure 13B:
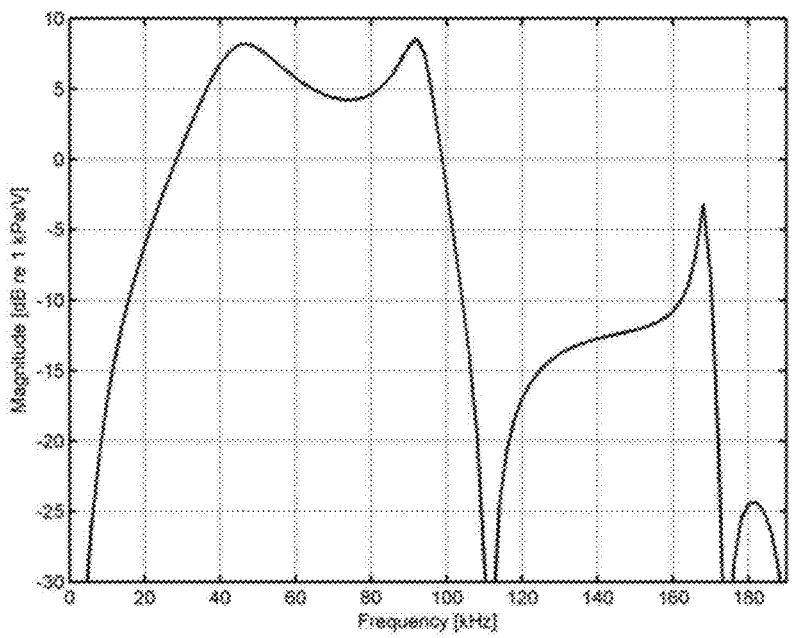
FIG. 13B is a transmission sensitivity chart for an embodiment of a cell having a backing layer that is thicker than the rail layer, for use in a transducer device in accordance with the invention, in which the rail and backing layers are made of different materials, brass and tungsten-epoxy.

FIG. 13B depicts data from an embodiment of a cell in which the rail and backing layers are made of different materials. The rail layer comprises brass and the backing layer comprises tungsten-infused epoxy. Similar to the device of FIG. 2C, in this embodiment, the rail layer height is about 1 mm and the backing layer height is about 10 mm. Transmission sensitivity in this embodiment is heavily altered.

Figure 13C:
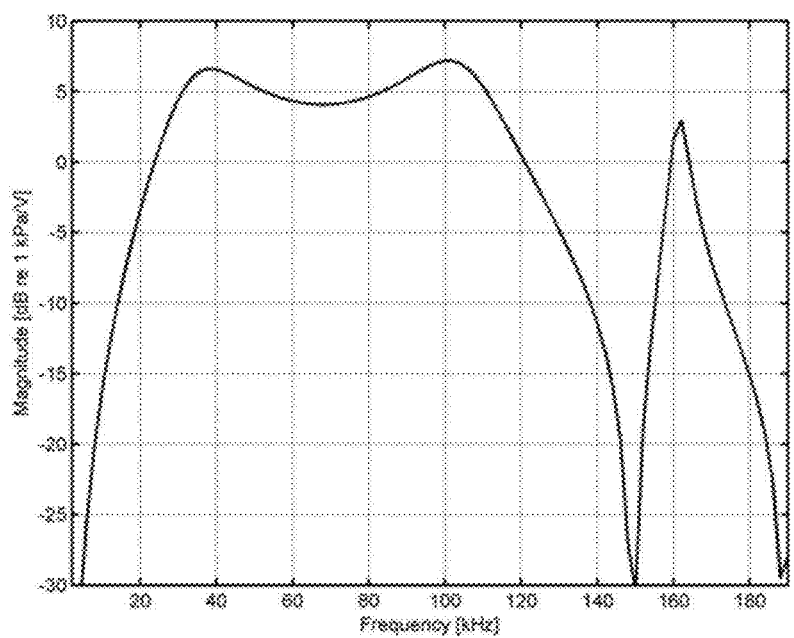
FIG. 13C is a transmission sensitivity chart for an embodiment of a cell having a backing layer that is thicker than the rail layer, for use in a transducer device in accordance with the invention, in which the rail and backing layers are both made of the same material, tungsten-epoxy.

FIG. 13C depicts data from a second embodiment of a cell in which the rail and backing layers are made of the same material, tungsten-filled epoxy. The rail layer height is about 1 mm, and the backing layer height is about 10 mm.

Figure 13D:
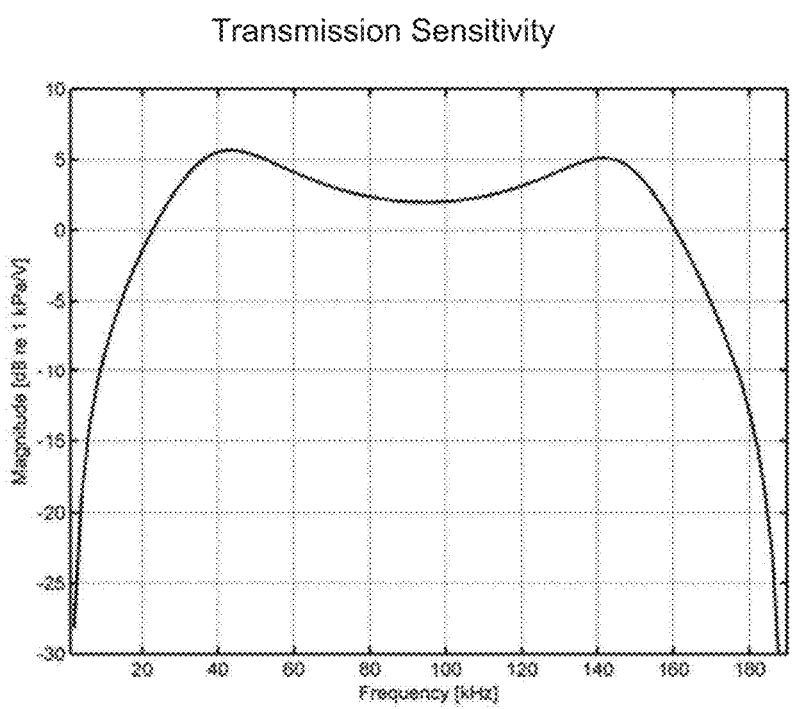
FIG. 13D is a transmission sensitivity chart for an embodiment of a cell having a backing layer that is thicker than the rail layer, for use in a transducer device in accordance with the invention, in which the rail and backing layers are made of different materials, tungsten-epoxy composite and brass composite.

FIG. 13D depicts data from a second embodiment of a cell in which the rail and backing are made of different materials. The rail layer comprises tungsten-infused epoxy and the backing layer comprises brass. In this embodiment, the rail layer height is about 1 mm and the backing layer height is about 10 mm. In this embodiment, the transmission sensitivity is altered, but the peak at higher frequencies may usefully enhance the bandwidth. Radial modes of the low-loss brass backing allows for radiation pattern alteration at certain frequencies.

As will be understood by the person having ordinary skill in the art, the particular design of each cell in the array will depend on the particular frequency that will be used. When a broad range of frequencies is to be used, it is a complicated endeavor to obtain a particular design that will work for all frequencies. A combination of a short rail layer and tall backing layer, manufactured from the same material, has been found to produce good (85%) efficiency for a broad range of frequencies, as described below.

Figure 14A:
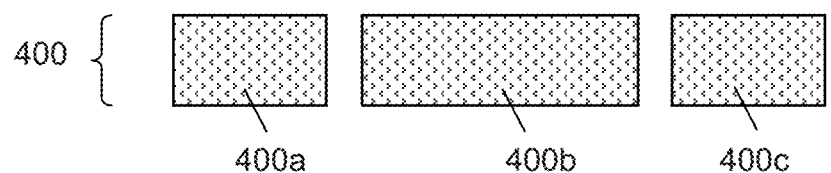
FIGS. 14A-P illustrate an embodiment of the method of fabrication of a multi-cell transducer according to the invention.
Figure 14B:
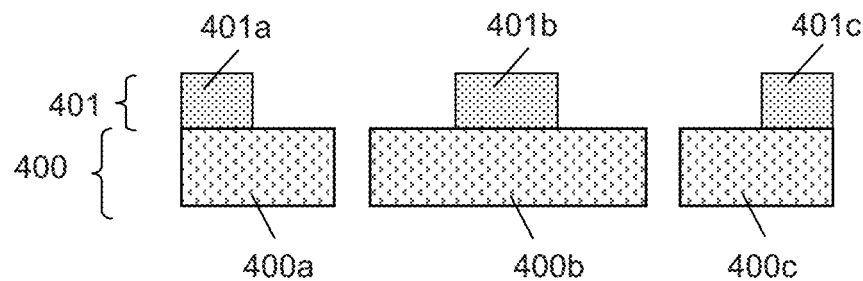
Figure 14C:
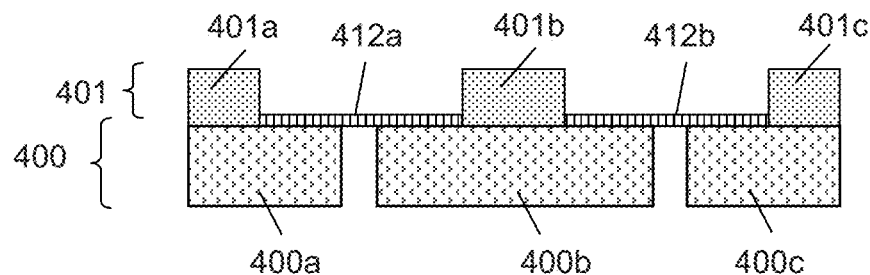
Figure 14D:
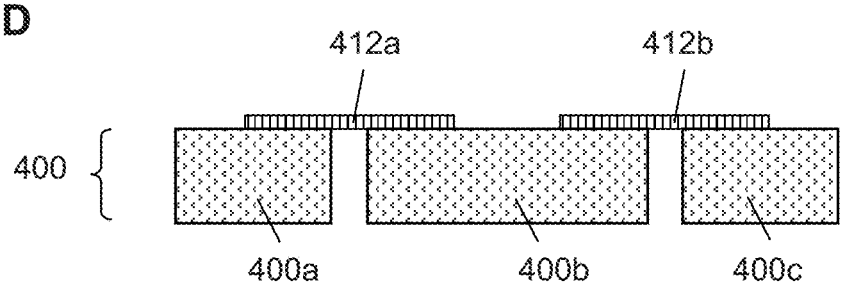
Figure 14E:
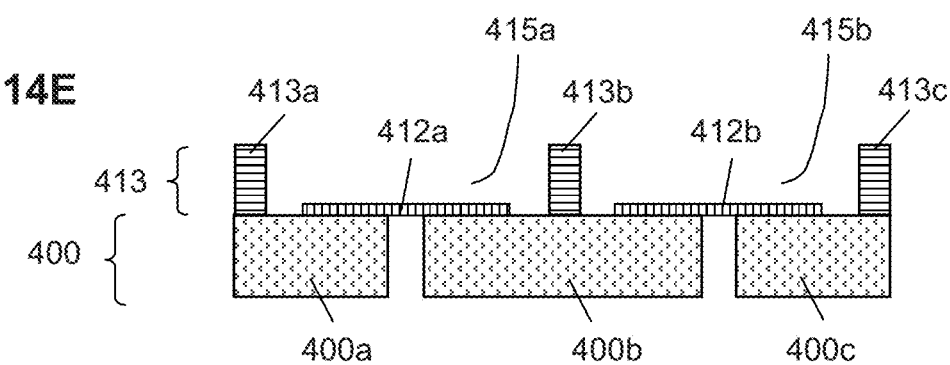
Figure 14F:
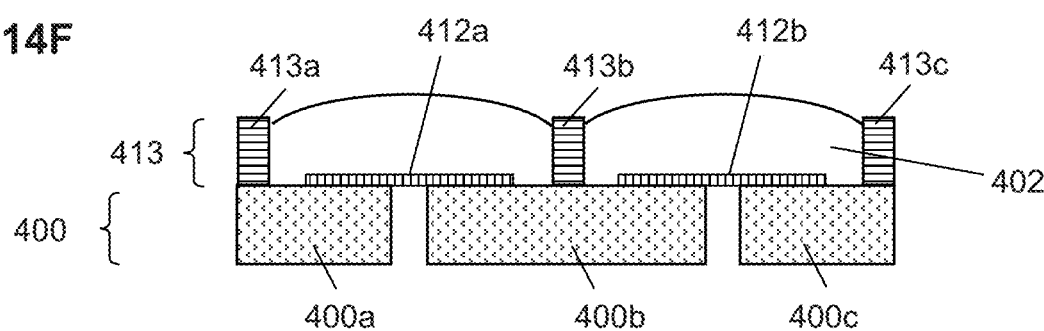
Figure 14G:
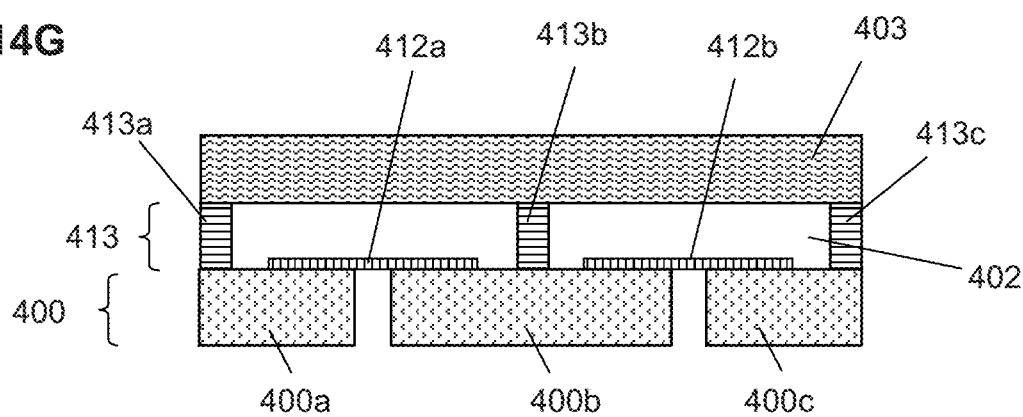
Figure 14H:
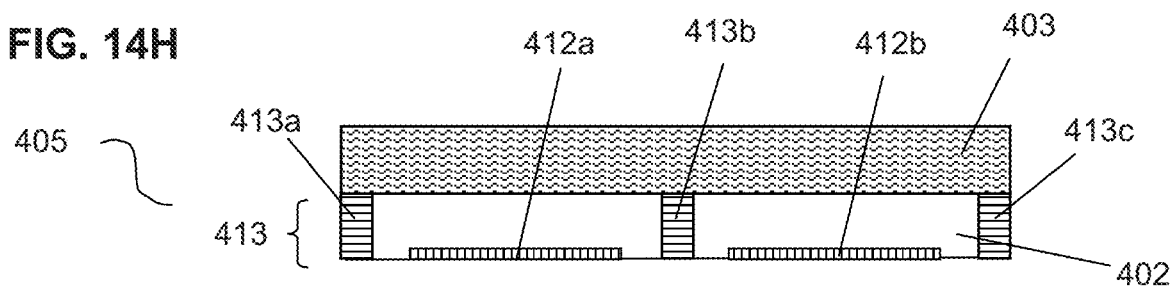

Another aspect of the invention relates to a process of fabricating the transducer device. FIGS. 14A-P schematically illustrate one embodiment of a method of manufacturing a transducer device in accordance with the invention, depicting a cross section through the structures using a two-cell example. One skilled in the art may scale up such a method to a multi-cell device having an array of 80-150 bilayer units, such as those described above, using the description provided herein. In general terms, the piezoelectric disks and the rail layer are formed as one assembly with one piezoelectric disk lying in the center of each aperture of the rail layer. The flexural plate is formed as a separate second assembly. The two assemblies are subsequently combined, by attaching the rail layer and piezoelectric disks to the flexural plate.

As illustrated in FIG. 14A, a vacuum-hold base 400 comprising a plurality of adjacent vacuum-hold base elements 400a-c is first placed on a flat surface. The vacuum-hold bases 400a-c are equally spaced apart from each other. An aligning tool 401 comprising a plurality of apertures between contact portions 401a-c is then placed on top of each of the vacuum-hold base elements 400a-c, each of the aligning tool apertures having a diameter. The contact portion 401a is aligned with and centered on vacuum-hold base element 400a, contact portion 401b aligned with and centered on vacuum-hold base element 400b, etc., as illustrated in FIG. 14B. After the aligning tool 401 is in position, a plurality of piezoelectric disks 412a-b are placed on the vacuum-hold base elements 400a-c in between the contact portions 401a-c of the aligning tool 401, as illustrated in FIG. 14C. The aligning tool 401 is used to position the array of piezoelectric disks 412a, 412b. Therefore, the distance between the edges of the aligning tool contact portions 401a-c (aperture diameter) will be roughly equivalent to the diameter of the piezoelectric disks 412a-b so that the piezoelectric disks 412a-b span the diameter of aligning tool apertures and cover gaps between the vacuum-hold bases 400a-c, as depicted in FIG. 14C. Vacuum is applied to hold the piezoelectric disks 412a, 412b on the vacuum-hold base elements 400a-c and the aligning tool 401 is then removed. FIG. 14D, depicts the piezoelectric disks 412a-b positioned in the desired array, resting on the vacuum-hold base elements 400a-c after the aligning tool has been removed. A rail layer 413 having a first surface, a second surface, a diameter and a plurality of apertures is then placed on the vacuum-hold base 400, so that the piezoelectric disks 412a-b are centered within the rail layer apertures between the rails 413a-c, and the first surface of the rail layer 413 contacts the vacuum-hold base 400, to form a plurality of cavities 415a, 415b, as depicted in FIG. 14E. Next the cavities 415a, 415b are filled with a curable polymer 402 up to the height of the rails 413a-c, as shown in FIG. 14F. Non-limiting examples of curable polymer 402 include RTV silicon, or any polymer that does not adhere to metals, plastics and piezo ceramics. Preferably, the curable polymer is pourable and curable at a relatively low temperature. The filled cavities are then covered with a flat tool 403, as illustrated in FIG. 14G, and the curing process is commenced. Once the polymer 402 is cured and vacuum is released, the vacuum-hold base 400 may be removed, as illustrated in FIG. 14H. This completes the fabrication of the first assembly 405.

Figure 14I:
Figure 14J:
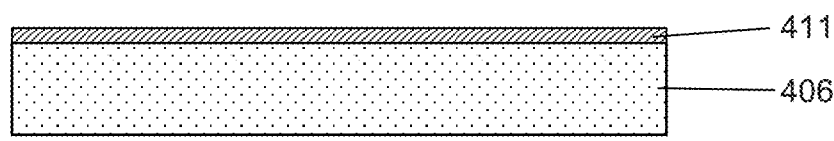
Figure 14K:
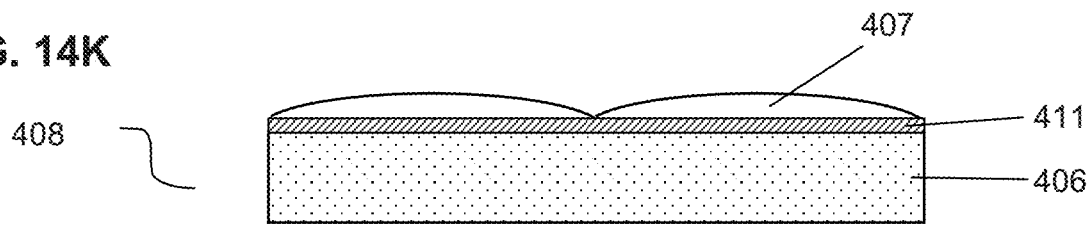
Figure 14L:
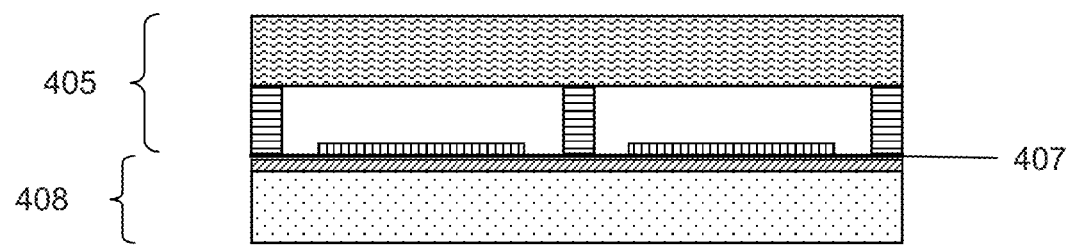
Figure 14M:
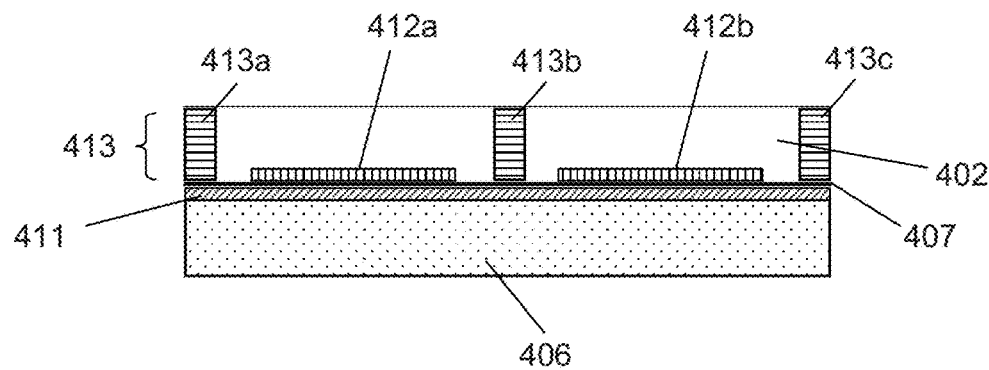
Figure 14N:
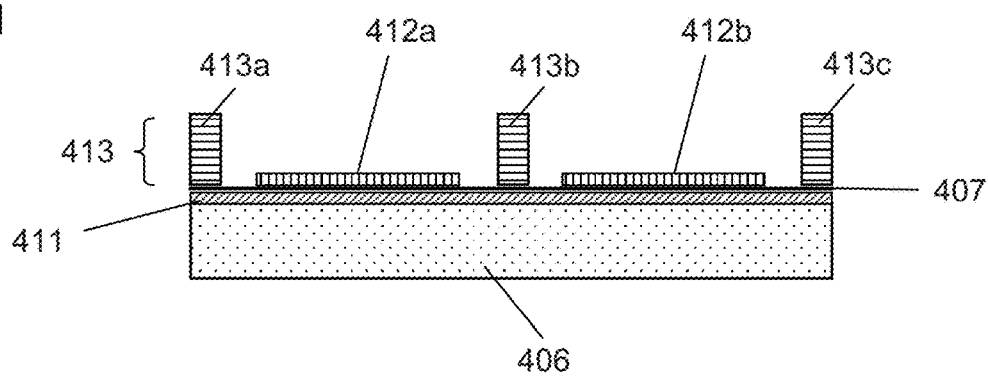
Figure 14O:
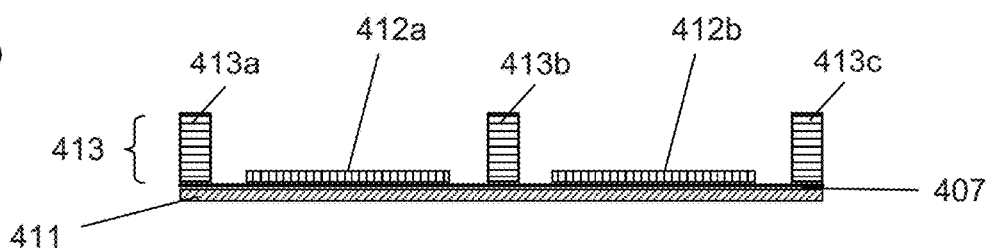
Figure 14P:
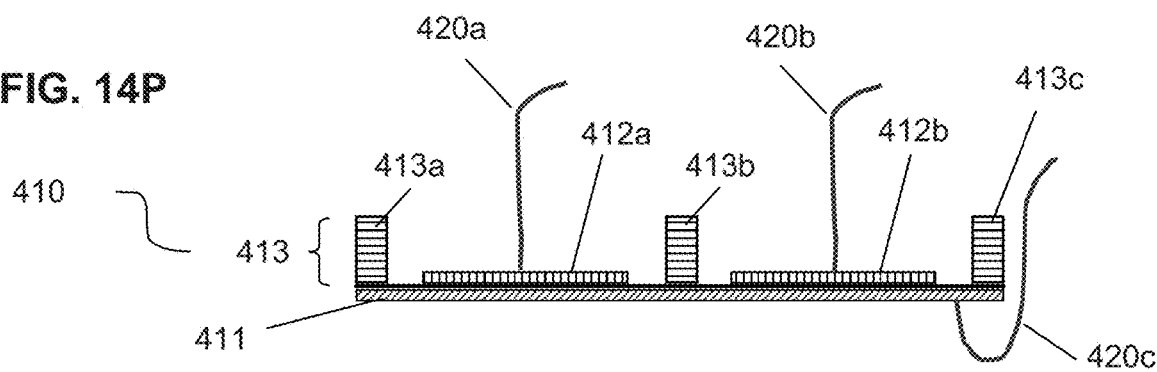

To prepare the second assembly, as shown in FIG. 14I, a plate holder 406 is placed on a flat surface. The flexural plate 411 having a first surface, a second surface and a diameter, is placed on the plate holder 406 as shown in FIG. 14J. Adhesive 407 is then applied to the entire first surface of the flexural plate 411, as illustrated in FIG. 14K. This completes the fabrication of the second assembly 408. The first assembly 405 is then placed on the second assembly 408, so that the first surface of the rail layer 413 contacts the adhesive 407 on the first surface of the flexural plate 411, as illustrated in FIG. 14L. The adhesive 407 is then cured, thereby attaching the first assembly 405 to the second assembly 408, i.e. to adhere the rail layer 413 and array of piezoelectric disks 412a-b to the flexural plate 411 and form the multi-cell array. The flat tool 403 is removed, as illustrated in FIG. 14M. The curable polymer 402 is removed, as illustrated in FIG. 14N. Subsequently, the plate holder 406 is removed, as illustrated in FIG. 14O. Finally, as illustrated in FIG. 14P, electrical wires 420a-c may then be attached to each of the piezoelectric disks 412 on the cavity side and to the second surface of the flexural plate 411, for example by soldering. This completes manufacture of the multi-cell transducer 410 comprising a planar array of piezoelectric cells in accordance with the invention, for an embodiment not having a backing layer.

A matching layer then may be attached to the flexural plate to form the novel ultrasonic transmitter of the present invention, useful for emitting ultrasonic energy into an environment, such as a body. If a backing layer is used, it may be cut to match the diameter of the rail layer and attached to the rail layer after the cell array is complete (FIG. 14P) or prior to adding the rail layer to the first assembly. In the latter case, the cavities formed by the rail layer backing layer assembly may be filled RTV silicone prior to step (FIG. 14E). The backing layer may be incorporated in an embodiment with or without the matching layer. When both the backing layer and matching layer are used in combination, the matching layer serves to damp "surface modes" and prevent acoustic crosstalk among the cells, which may alter the transmit frequency response of the device in immersion.

Thus, in one embodiment, the method of the invention may comprise: placing on a flat surface a vacuum-hold base comprising a plurality of equally-spaced apertures; placing an aligning tool on said plurality of vacuum-hold base, said aligning base comprising a plurality of equally sized and spaced apertures; using said aligning tool to set an array of piezoelectric disks on said vacuum-hold elements over said vacuum-hold base apertures and equally space each of said piezoelectric disks from each other; wherein each of said piezoelectric disks has a diameter slightly smaller than a corresponding aligning tool aperture diameter to allow said piezoelectric disk to fit within said corresponding aligning tool aperture; generating a vacuum through said vacuum-hold base and removing said aligning tool; placing a rail layer having a first surface, a second surface and a diameter onto said vacuum-hold base so that said first surface contacts said vacuum-hold base, said rail layer comprising a plurality of apertures in an array corresponding to said array of piezoelectric disks, said rail layer aperture diameters larger than said piezoelectric disk diameter, said rail layer having a vertical height to define a plurality of cavities corresponding to said plurality of rail layer apertures; filling said plurality of cavities with a curable polymer fill; covering said filled cavities with a flat tool; curing said curable polymer; removing said vacuum; removing said vacuum-hold base to form a first assembly; separately providing a plate holder and placing on said plate holder a flexural plate having a first surface, a second surface and a diameter equivalent to said rail layer diameter; applying a curable adhesive to said first surface of said flexural plate to cover said first surface of said flexural plate and to form a second assembly; placing said first assembly on said second assembly so that said first surface of said rail layer contacts said adhesive on said first surface of said flexural plate; curing said adhesive; removing said flat tool; removing said cured polymer fill; and removing said plate holder. The method may further comprise adhering a matching layer to said second surface of said flexural plate. The method may still further comprise adhering a backing layer to said second surface of said rail layer.

Second order effects on the system, such as peaking effects and consequent reduction of sensitivity and/or bandwidth, relating to the adhesive, have been observed. For example there are elastic constraints produced by the adhesion between the flexural plate and the rail layer and piezoelectric disks. Further, the thickness of the adhesive may be between about 10-50 µm, and may affect transmission sensitivity.

It will be appreciated by persons having ordinary skill in the art that many variations, additions, modifications, and other applications may be made to what has been particularly shown and described herein by way of embodiments, without departing from the spirit or scope of the invention. Therefore it is intended that the scope of the invention, as defined by the claims below, includes all foreseeable variations, additions, modifications or applications.

What is claimed is:

1. A method for fabricating a multi-cell electroacoustic transducer, comprising steps of:
   a) placing on a flat surface a vacuum-hold base comprising a plurality of equally-spaced apertures;
   b) aligning an array of piezoelectric disks over said vacuum-hold base apertures to equally space each of said piezoelectric disks from each other;
   c) generating a vacuum through said vacuum-hold base;
   d) placing a rail layer having a first surface, a second surface and a diameter onto said vacuum-hold base so that said first surface contacts said vacuum-hold base, said rail layer comprising a plurality of apertures in an array corresponding to said array of piezoelectric disks, each of said rail layer apertures having a different diameter, wherein each is larger than said piezoelectric disk diameter, said rail layer having a vertical height to define a plurality of cavities corresponding to said plurality of rail layer apertures;
   e) filling said plurality of cavities with a curable polymer fill;
   f) covering said filled cavities with a flat tool;
   g) curing said curable polymer;
   h) removing said vacuum;
   i) removing said vacuum-hold base to form a first assembly;
   j) separately providing a plate holder and placing on said plate holder a flexural plate having a first surface, a second surface and a diameter equivalent to said rail layer diameter;
   k) applying a curable adhesive to said first surface of said flexural plate to cover said first surface of said flexural plate and to form a second assembly;
   l) placing said first assembly on said second assembly so that said first surface of said rail layer contacts said adhesive on said first surface of said flexural plate;
   m) curing said adhesive;
   n) removing said flat tool;
   o) removing said cured polymer fill; and
   p) removing said plate holder.

2. The method of claim 1, further comprising steps of:
   placing an aligning tool on said vacuum-hold base, said aligning tool comprising a plurality of equally sized and spaced apertures; and
   removing said aligning tool after said generating step; wherein said aligning step further includes using said aligning tool to set said array of piezoelectric disks over said vacuum-hold base apertures on said vacuum-hold base,
   wherein each of said piezoelectric disks has a diameter smaller than a corresponding aligning tool aperture diameter to allow said piezoelectric disk to fit within said corresponding aligning tool aperture.

3. The method of claim 1, further comprising a step of attaching wires to said flexural plate and said plurality of piezoelectric disks.

4. The method of claim 3, further comprising a step of adhering a matching layer to said second surface of said flexural plate.

5. The method of claim 3, further comprising a step of adhering a backing layer to said second surface of said rail layer.

* * * * *